(12) United States Patent
Rashkes et al.

US006433557B1

(10) Patent No.: US 6,433,557 B1
(45) Date of Patent: Aug. 13, 2002

(54) ELECTRICAL SYSTEM WITH CAPACITANCE TAP AND SENSOR FOR ON-LINE MONITORING THE STATE OF HIGH-VOLTAGE INSULATION AND REMOTE MONITORING DEVICE

(75) Inventors: Viktor S. Rashkes, Plymouth; Alexander Golubev, Maple Grove, both of MN (US)

(73) Assignee: Eaton Corporation, Cleveland, OH (US)

( * ) Notice: Subject to any disclaimer, the term of this patent is extended or adjusted under 35 U.S.C. 154(b) by 50 days.

(21) Appl. No.: 09/742,606

(22) Filed: Dec. 21, 2000

(51) Int. Cl.[7] .......................... H01H 31/12; G01R 31/14
(52) U.S. Cl. ...................... 324/551; 324/541; 324/544; 324/536; 324/552; 324/509; 324/510
(58) Field of Search ................................ 324/551, 541, 324/552, 536, 544, 509, 510, 511, 127; 340/870.18

(56) References Cited

U.S. PATENT DOCUMENTS

| 4,757,263 A | | 7/1988 | Cummings, III | 324/552 |
|---|---|---|---|---|
| 4,914,382 A | * | 4/1990 | Douville et al. | 324/127 |
| 5,471,144 A | | 11/1995 | Meyer | 324/551 |
| 5,574,378 A | | 11/1996 | Meyer et al. | 324/541 |
| 5,612,624 A | * | 3/1997 | Clinton | 324/551 |
| 5,640,154 A | | 6/1997 | Meyer et al. | 340/870.18 |
| 5,652,521 A | | 7/1997 | Meyer | 324/551 |
| 5,708,364 A | * | 1/1998 | Vokey et al. | 324/523 |
| 5,903,158 A | | 5/1999 | Eriksson | 324/536 |
| 5,903,159 A | * | 5/1999 | Miyata et al. | 324/536 |

(List continued on next page.)

FOREIGN PATENT DOCUMENTS

SU 296062 11/1971 .......... G01R/31/02

OTHER PUBLICATIONS le;.5qBraunlich et al., Assessment of Insulation Condition of Large Power Transformers by On–Site Electrical Diagnostic Methods, IEEE International Symposium on Electrical Insulation, Anaheim, CA USA, Apr. 2–5, 2000.*

Experience in the Application of the On–Line Monitoring System Using Power Emergency Frequency and Partial Discharges to High Voltage Transformer and Bushing Insulation—Z. Berler, L. Letitskaya. V.S. Rashkes, P. Svy EPRI Substation Equipment Diagnostics Conference VI, Feb. 16–18, 1998, New Orleans, LA.

(List continued on next page.)

*Primary Examiner*—N. Le
*Assistant Examiner*—Wasseem Hamdan
(74) *Attorney, Agent, or Firm*—Martin J. Moran

(57) ABSTRACT

A sensor and associated circuits are provided for on-line monitoring of the state of the high-voltage insulation in electrical equipment with capacitance tap. In this arrangement, both the power frequency signal and the radio frequency signals associated with partial discharge activity are sensed. These signals are transmitted from the sensor to remote monitoring instrumentation via one connecting cable. The sensor contains a surge arrester in parallel with a capacitor shunt, a radio frequency current transformer and a connecting circuit. The polarity terminal of the primary winding of the radio frequency current transformer is connected to the tap output. The non-polarity terminal is connected to the common connection point of the surge arrester and the capacitor shunt while the second terminals of these components are connected to the local ground. The non-polarity terminal of the secondary winding of the radio frequency current transformer is connected to the non-polarity terminal of its primary winding, and the polarity terminal-to the signal conductor of the connecting circuit. The second conductor of the connecting circuit is connected to the local ground. Both the power frequency signal and the radio frequency signal are transmitted on the same cable from the sensor to the remote monitoring instrumentation.

16 Claims, 13 Drawing Sheets

SEN

REM

U.S. PATENT DOCUMENTS

| | | | | |
|---|---|---|---|---|
| 5,933,012 A | * | 8/1999 | Bengtsson et al. | 324/524 |
| 6,028,430 A | | 2/2000 | Frielingsdorf | 324/519 |
| 6,035,265 A | * | 3/2000 | Dister et al. | 702/183 |
| 6,052,050 A | * | 4/2000 | Colbaugh et al. | 340/310.01 |
| 6,087,836 A | * | 7/2000 | Divljakovic et al. | 324/772 |
| 6,172,862 B1 | | 1/2001 | Jonnatti et al. | 361/78 |

OTHER PUBLICATIONS

On–Line Monitoring of Power Transformers—Trends, New Developments and First Experiences—T. Liebfried, W. Knorr, K. Viereck—CIGRE, 1998, #12–211.

Methods and Devices for Diagnostics of High–Voltage Equipment, P. M. SVI (Month unavailable) 1992.

* cited by examiner

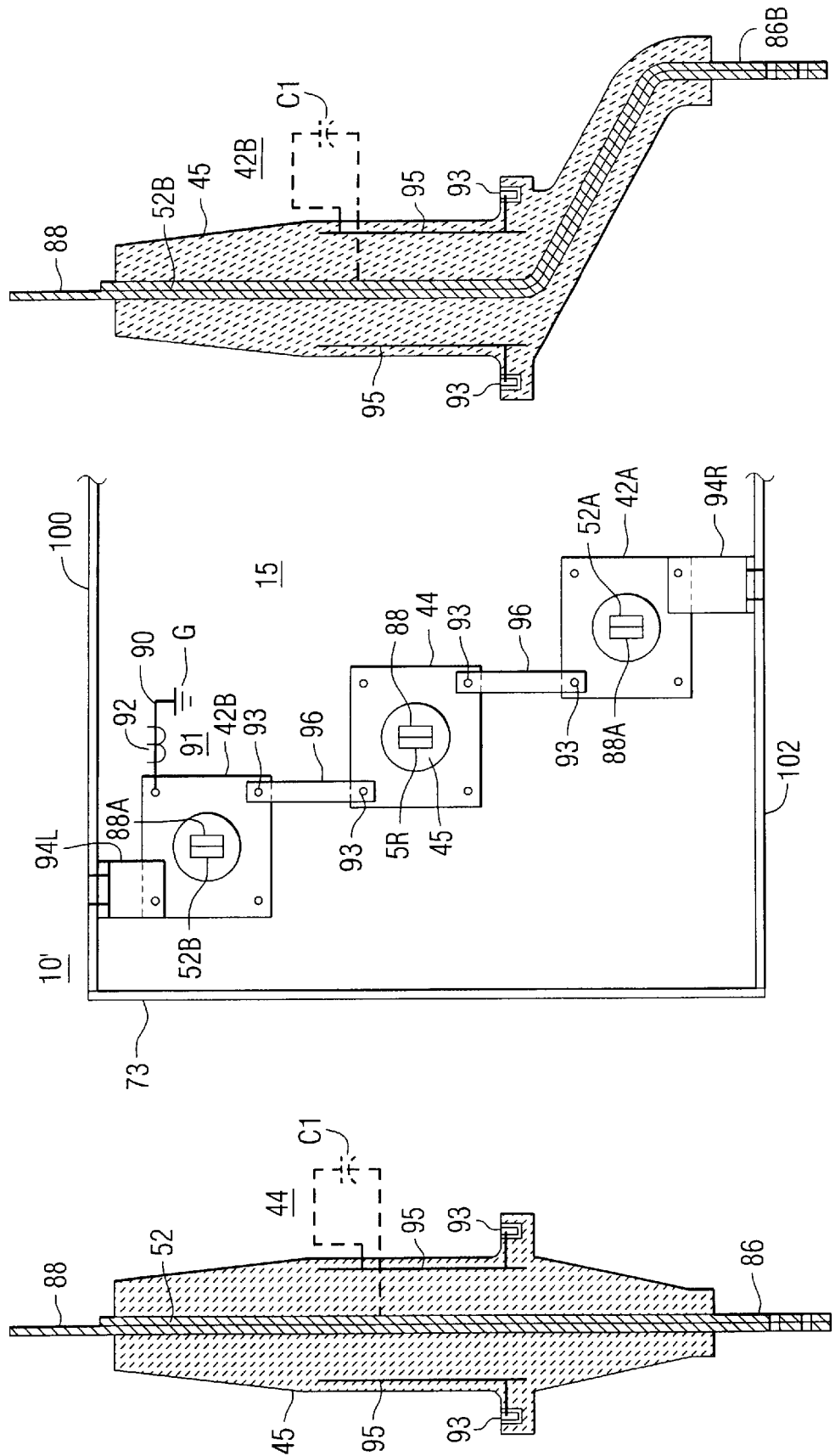

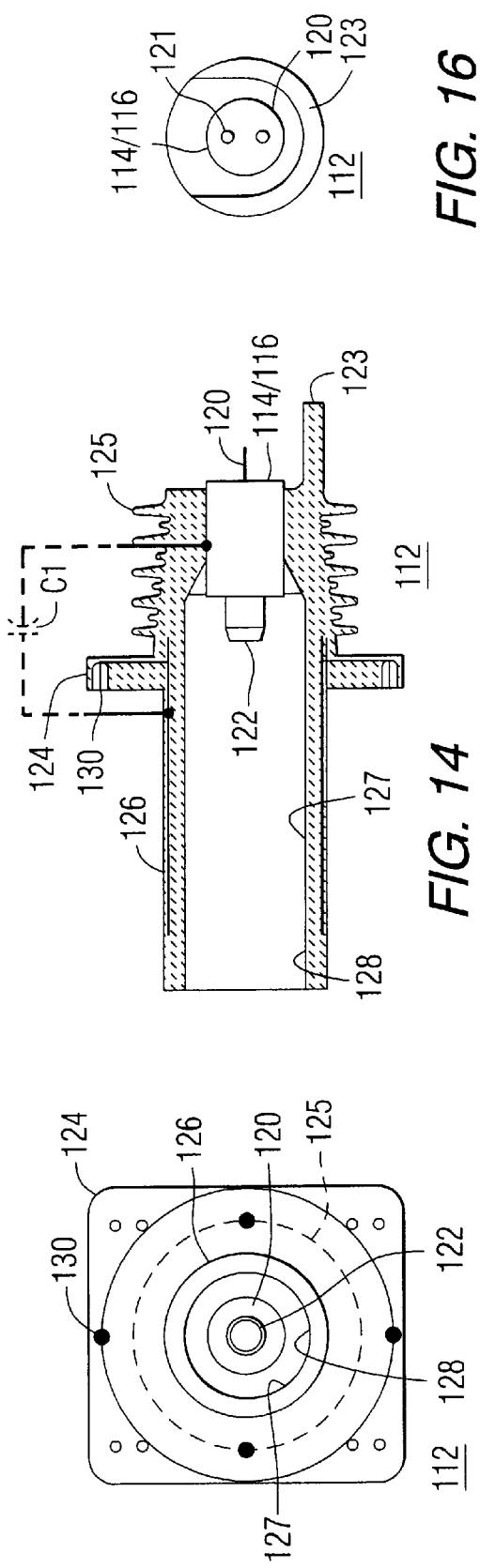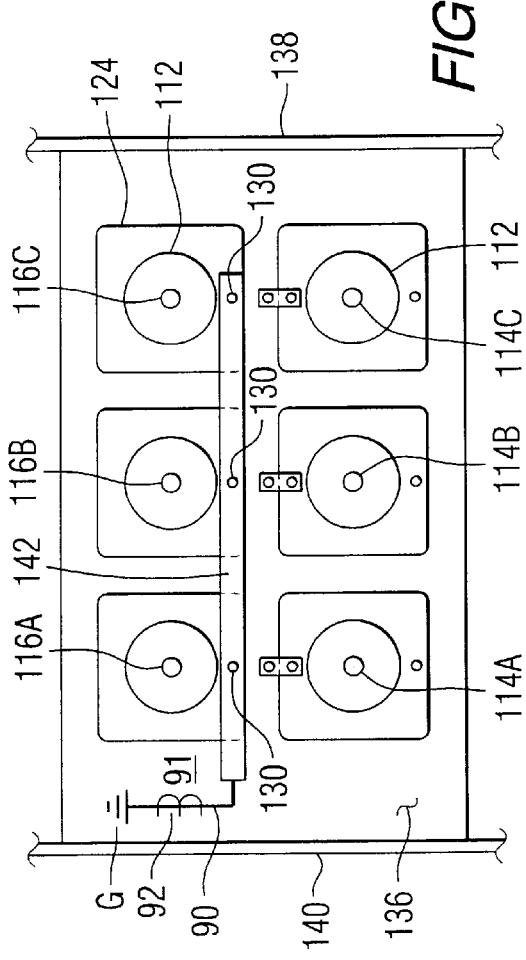

ELECTRICAL SYSTEM WITH CAPACITANCE TAP AND SENSOR FOR ON-LINE MONITORING THE STATE OF HIGH-VOLTAGE INSULATION AND REMOTE MONITORING DEVICE

BACKGROUND

1. Field of the Invention

This invention relates to sensors used for on-line monitoring of the state (condition) of high voltage insulation in electrical equipment with capacitance (potential) taps and the interconnection therewith to remote measuring devices. The electrical equipment may include bushings of power transformers, shunt reactors or circuit breakers and current transformers.

2. Description of Prior Art

The On-line monitoring of high-voltage insulation of electrical equipment is performed on the equipment under operation, i.e. in the actual operating condition. Equipment de-energization is required only for the initial sensor installation. As increasingly reliable and cost- and labor-effective, this technology is now widespread in numerous applications. Particularly, such monitoring provided concurrently on power frequency and radio frequencies may be an effective tool in prediction and prevention of in-service failures for high-voltage bushings and other equipment with capacitance (potential) taps.

Attention is called to the following Publications:

"Methods and Tools for High-Voltage Equipment Diagnostics", Energoatomizdat Publishing House, Moscow, by P. Svy 1992.

"Experience in the Application of the On-Line Monitoring System Using Power Frequency and Partial Discharges to High Voltage Transformer and Bushing Insulation", by Z. Berler, L. Letitskaya and P. Svy, EPRI Substation Equipment Diagnostic Conference VI, Feb. 16–18, 1998, New Orleans, La.

Bushings of power transformers, shunt reactors or circuit breakers and current transformers, with their internal insulation of oil-impregnated paper similar to that used in cables or capacitors, are equipped with so called capacitance or potential taps. A capacitance tap is connected to a metal foil shield inserted inside the insulation. The insulation has certain capacitance and conductance between the high voltage current-carrying conductor and the foil shield. Both the capacitance value and the power factor of the insulation depend upon the insulation condition and could be quantified at the tap output with the equipment on-line. Furthermore, the electrical impulses that accompany partial discharges inside the insulation are also coupled to the output of the capacitance tap and can be detected using circuits of a suitable design.

The capacitance taps were originally designed only for relatively rare off-line insulation tests using a suitable test source at power frequency. During equipment operation they remained grounded. It was recognized that these taps lend themselves as excellent means of on-line monitoring of the insulation. The use of the capacitance tap for an on-line monitor requires a sensing device to be inserted permanently between the live tap contact and the ground. The aforementioned publications teach such an arrangement.

The sensor designed for the power frequency measurement produces a signal proportional to the capacitive current through the bushing insulation. The sensor designed for partial discharges senses the radio frequency impulses and produces a signal of magnitude proportional to the dissipated electrical charges. The repetition rate of such discharges can be determined by a measuring device.

Sensors based on application of current transformers are described in U.S. Pat. No. 5,471,144 "System for Monitoring the Insulation Quality of Step Graded Insulated High Voltage Apparatus" issued Nov. 29, 1995; U.S. Pat. No. 5,574,378 "Insulation Monitoring System for Insulated High Voltage Apparatus" issued Nov. 12, 1996; U.S. Pat. No. 5,640,154 "Insulation Monitoring System for Insulated High Voltage Apparatus" issued Jun. 17, 1997; and U.S. Pat. No. 5,652,521 "Insulation Monitoring System for Insulated High Voltage Apparatus" issued Jul. 29, 1997 and in the Svy reference, P. 107. They consist of a current transformer with a primary winding created by the capacitance tap grounding conductor, and a secondary toroidal winding consisting of several or many turns. This current transformer can be coreless (so-called Rogovsky coil), as suggested in the above mentioned patents for power frequency measurements, or with a ferrite core, as recommended in the Svy Reference for the radio frequency impulse measurements. The advantage of the current transformer-based sensor is its simplicity. A current transformer with its secondary winding loaded with a small resistance has small input impedance, so there is usually no need for a special tap overvoltage protection.

Monitoring of radio frequency (partial discharge) impulses imposes different requirements on sensor design, as opposed to monitoring of signals at power frequency. For partial discharge monitoring it is desirable to detect a frequency band generally between 0.5 and 20 MHz with high sensitivity. Ferrite radio frequency transformers with a small number of turns in the secondary winding are appropriate for this task as they are capable of accurately transmitting short and steep pulses, but they block power frequency signal. A coreless current transformer with a large number of turns in the secondary winding can be employed for power frequency measurement, but it is practically insensitive to weak partial discharge pulses. To meet both requirements, two separate transformers, one of each type, are necessary.

A coreless Rogovsky coil has a low sensitivity even at the power frequency signals. For this reason it was replaced with a resistor shunt connected between the output of the tap and local ground (Russian Patent 292,062, published Feb. 12, 1971). The measured quantity, a power frequency voltage drop across the resistor shunt, is directly proportional to the capacitive current through the bushing insulation. The magnitude of the power frequency signal can be conveniently controlled by the resistance chosen for the shunt. The disadvantage of such an arrangement is that the tap capacitance, between the high voltage line and the output of the capacitance tap, in series with the resistance of the sensor shunt represents a frequency dependent voltage divider. As a result, switching and lightning transients can cause severe overvoltages at the output of the tap due to their very high frequencies. These transients have the potential of destroying not only the measuring circuit, but also the insulation of the tap output or even the bushing. To limit the transients, a surge arrestor is added in parallel to the resistor shunt, as shown in the Svy Reference, on its FIG. 8.2.

A further improvement of the sensor consisted of replacing the resistor shunt with another capacitor, see U.S. Pat. No. 4,757,263 "Insulation Power Factor Alarm Monitor" issued Jul. 12, 1988; U.S. Pat. No. 5,903,158 "Monitoring of Internal Partial Discharges in a Power Transformer" issued May 11, 1999; and U.S. Pat. No. 6,028,430 "Method for Monitoring a Capacitor Bushing, and Monitoring System" issued Feb. 22, 2000. This arrangement features a capacitor divider ratio that is essentially independent of frequency, thus minimizing the exposure of the tap and the low voltage circuits to destructive switching and lightning impulses. A surge arrester is kept in place as a "second line of defense" for rare cases of extremely severe overvoltages.

All of the sensor designs described above are mutually exclusive in that they can satisfy only one application at a time; a power frequency signal detection or a partial discharge detection, but not both. With only one capacitance tap available per bushing, this represented a serious disadvantage as the replacement of a bushing sensor requires outage.

A Publication entitled "On-Line Monitoring of Power Transformer-Trends, New Developments and First Experiences" by T. Leibfried, W. Knorr, K. Viereck, CIGRE, 1998, #12–211, teaches a sensor that can contain both circuits. The sensor relies on the capacitor shunt connected to the tap output and the radio frequency current transformer the primary winding of which is connected in series with the capacitor shunt, either on its grounded side or on its "live" side. Two separate coaxial cables carry power frequency and radio frequency signal signals respectively. Similar sensors were used by Cutler-Hammer starting in 1996.

These sensors have disadvantages. It is the necessity to use two cables to carry the information extracted from a sensor. Another disadvantage is that, compared with the sensor that utilizes a current transformer only, this sensor has lower sensitivity to partial discharge impulses: on high frequencies the stray capacitance of the surge arrester shunts the circuit of series connected radio frequency current transformer and capacitor shunt, thus diverting part of high frequency current from entering into current transformer.

SUMMARY OF THE INVENTION

In accordance with the invention, a partial discharge determination system for an electrical system which includes: a conductor at a given voltage potential, electrical insulation disposed proximate the conductor and an insulator capacitance disposed in the insulation which conducts partial discharge electrical current is taught. The partial discharge electrical component may be random and occasional. It has a radio frequency impulse associated therewith. A steady state generally continuous power frequency current component may flow in parallel at the same time. There is a sensor capacitor shunt, the primary winding of the sensor current transformer is connected electrically to the insulator capacitance to conduct partial discharge electrical current there through. There is also a coaxial cable, the coaxial cable is connected to the sensor current transformer primary winding. There is also present a monitoring power frequency capacitor. A monitoring radio frequency isolation transformer is also present. A monitoring choke coil is present. The monitoring choke coil and the monitoring power frequency capacitor are interconnected electrically with the coaxial conductor. There is a monitoring surge arrester. The monitoring choke coil, the monitoring surge arrester and the monitoring power frequency capacitor are interconnected electrically with the coaxial conductor. A first signal representative of an electrical power frequency current component exists between the monitoring choke coil and the monitoring surge arrester. A second signal representative of the radio frequency current associated with partial discharge component exists between the monitoring radio frequency isolation transformer and the monitoring radio frequency isolation transformer secondary winding second end.

BRIEF DESCRIPTION OF THE DRAWINGS

For a better understanding of the invention reference may be had to the preferred embodiment thereof shown in the accompanying drawings in which:

FIG. 8 is a side elevation, in section showing a line conductor insulator for th[0085] switchgear of FIG. 1;

FIG. 9 shows a side elevation, partially cut away, of a line conductor insulator similar to that shown in FIG. 8 but with an offset;

FIG. 10 shows an arrangement for the line conductors of FIG. 8 and FIG. 9 including partial discharge monitoring structure;

FIG. 14 shows a side elevation of a current transformer bottle depicted in FIG. 11;

FIG. 15 shows a front view of the current transformer bottle of FIG. 14;

FIG. 16 shows a rear view of the current transformer bottle of FIG.

FIG. 17 shows an arrangement of current transformer bottles of the type shown in FIG. 14 disposed in a structure for partial discharge sensing;

DESCRIPTION OF THE PREFERRED EMBODIMENT

Figure 1:
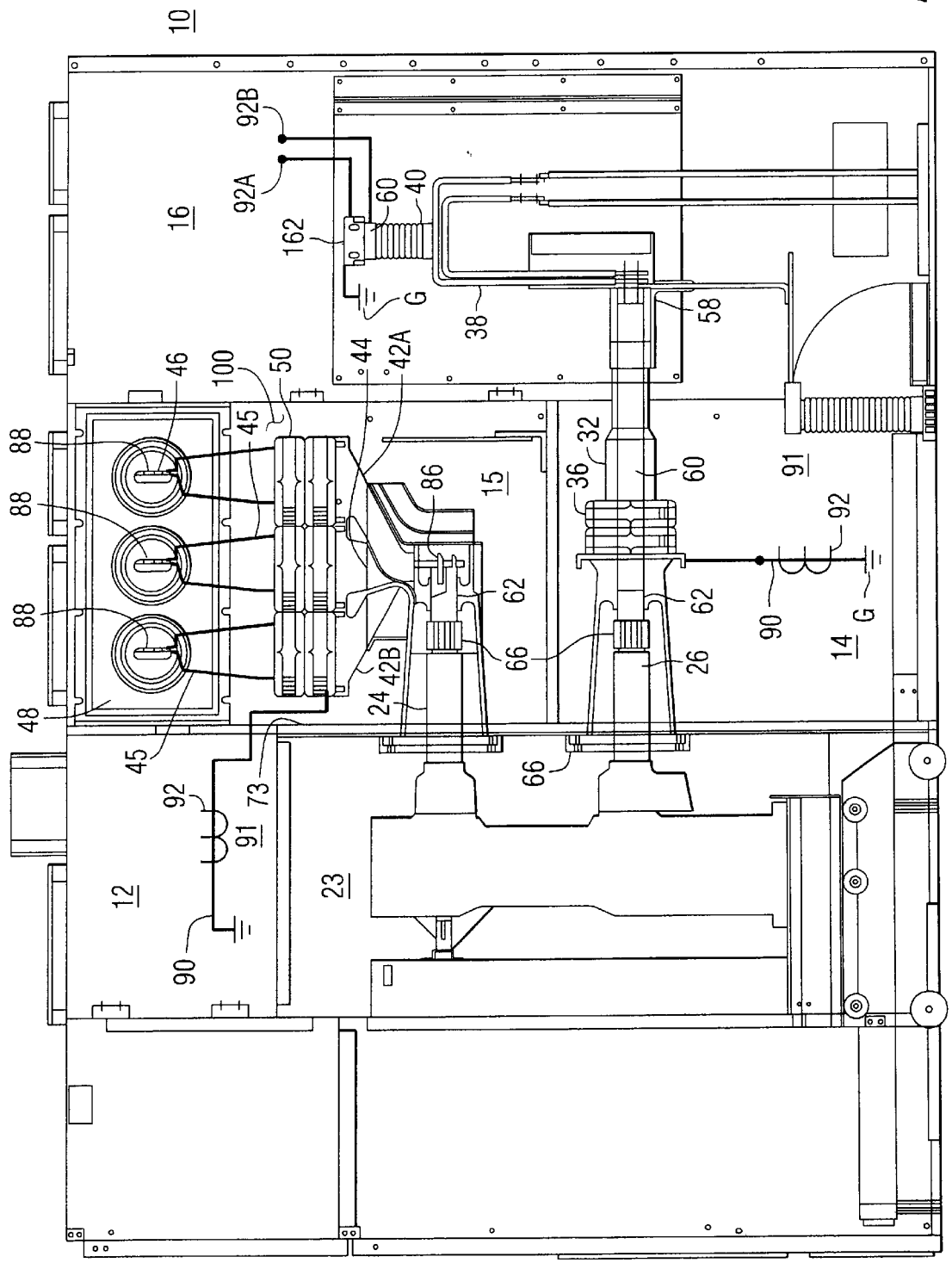
FIG. 1 depicts side elevation, partially in section of a switchgear circuit breaker cell utilizing concepts of the present invention.

Referring now to FIG. 1 there is depicted a switchgear system or apparatus cabinet or side entry switchgear 10 with side entry line buses. There is disposed within the side entry switchgear 10 a front compartment or circuit breaker compartment 12 shown on the left, and a central lower or load compartment 14 shown in the lower center. Shown to the right is a rear compartment or cable compartment 16. Movably disposed within the circuit breaker compartment 12 is a medium voltage circuit breaker 23. Circuit breaker 23 includes a line side circuit breaker terminal bushing 24 and a load side circuit breaker terminal bushing 26. The latter two bushings, in this embodiment of the invention, are disposed one above the other and protrude into the load compartment 14. Load side terminal bushing 26 is interconnected with a load terminal current transformer spout bushing 32. There is provided, a load terminal current transformer 36 (CT) which is disposed annularly around the load spout bushing 32. The load spout bushing 32 insulatingly surrounds a current transformer spout bushing conductor 60. Bushing conductor 60 is interconnected electrically with a load bus 38. Load bus 38 may be supported within the cable compartment 16 by way of an inventive insulator with partial discharge sensor 40. The function and operation of stand-off insulator 40 will be described in greater detail hereinafter. There is also provided a central upper or line compartment 15. In line compartment 15 may be disposed a line current transformer spout right off-set vertical bushing 42A and a line current transformer spout left off-set vertical bushing 42B. There may be also provided a line current transformer spout non-offset vertical bushing 44. The interconnections of the immediately aforementioned bushings with the various line side terminal bushings 24 of the circuit breaker 23 will be described hereinafter in greater detail with respect to FIG. 11. Each of the vertical bushings 42A, 42B and 42C may have identical line current transformer spout upper vertical bushing portions 45 as is also shown in FIGS. 8 and 9, for example. Conductors in each of the upper vertical bushing portions 45 may be interconnected at right angles with line bus conductors 46 as is best shown schematically in FIG. 11. A line spout insulating support plate 48 may be utilized to space and support the line bus conductors 46. There may be provided line spout current transformers 50 annularly disposed around each of the line current transformer spout upper vertical bushing portions 45.

Figure 2:
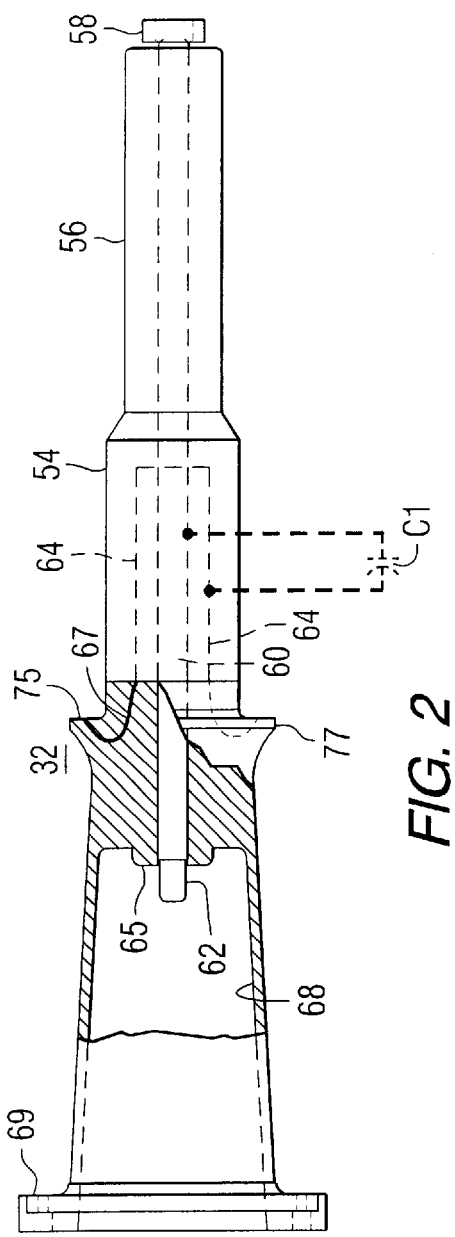
FIG. 2 depicts a side elevation, partially broken away, of a circuit breaker connection spout of a kind shown in FIG. 1.
Figure 3:
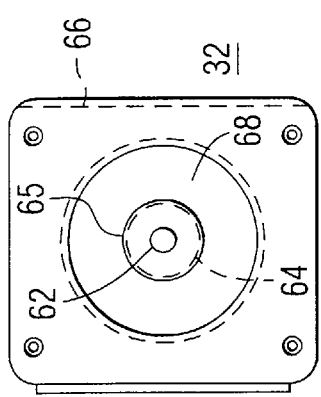
FIG. 3 depicts a front view of the spout of FIG. 2.
Figure 4:
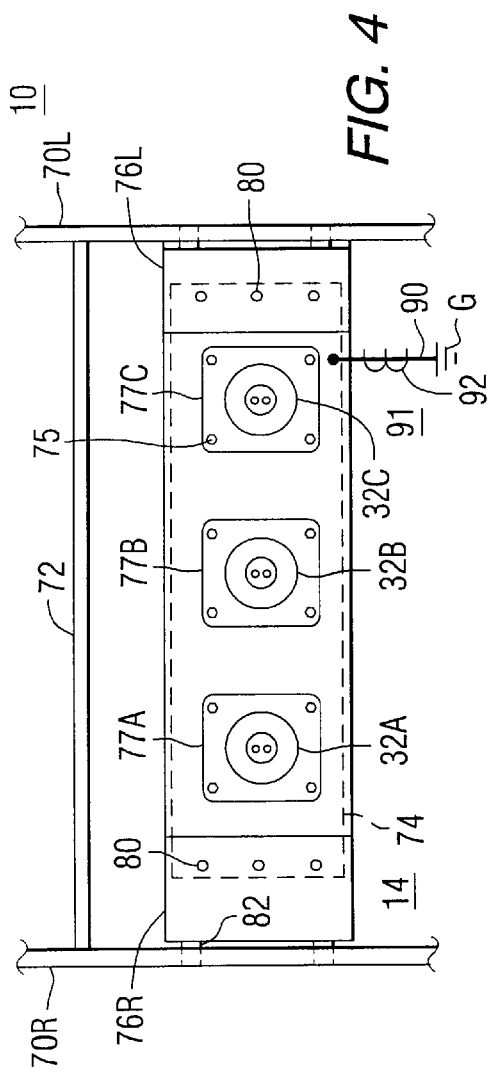
FIG. 4 depicts a rear view of three of the spouts shown in FIGS. 1 and 2 disposed in a structure for monitoring partial discharge.

Referring now to FIGS. 2–4 as well as FIG. 1, further description of the load spout bushing 32 is set forth. Load spout bushing 32 includes an axially aligned load terminal bushing wider cylinder 54 axially interconnected with a hollow load terminal bushing narrower cylinder 56. These may be alternatively referred to as the wider cylinder 54 and narrower cylinder 56 respectively. The latter two cylinders insulatingly encircle a bushing conductor 60 which terminates at the external end thereof with a load terminal current transformer spout bushing conductor to load bus connector 58. Conductor 60 terminates at the internal end thereof with a current transformer spout-connecting stub 62. There is provided radially internally of the wider cylinder 54, a load terminal current transformer bushing spout voltage stress shield 64 which circumferentially surrounds the bushing conductor 60 in common axial alignment between the outer cylindrical surface of the conductor 60 and the cylindrical surface of the wider cylinder 54. There is provided axially adjacent the rear of wider cylinder 54 a load terminal current transformer bushing spout connecting stub support 65. It is through the central axis of the stub support 65 that the connecting stub 62 protrudes for interconnection with the load side terminal bushing 26. There are disposed at the ends of the line side terminal bushing 24 and load side terminal bushing 26, circuit breaker load terminal connector arrays 66. It is these arrays which interconnect with the connecting stub 62 in the load spout bushing 32. There is provided a load terminal current transformer spout voltage stress shield lead wire 67 which interconnects the stress shield 64 with a stress shield-to-aluminum support piece connecting bolt 75. The latter connecting bolt is disposed in the load terminal current transformer spout support piece flange 77. Part of the load spout bushing 32 includes a hollow cylindrical load terminal current transformer spout shell wall 68. It is axially into this hollow region formed by the shell wall 68 that the aforementioned connecting stub 62 protrudes for interconnection with the breaker terminal connector array 66. The shell wall 68 terminates on one end at the stub support 65 and at the other end in a load terminal current transformer spout mounting flange 69.

Referring now more particularly to FIG. 4 as well as FIGS. 1–3, an arrangement for disposing load spout bushings 32 in a three-phase electrical disposition within the side entry switchgear 10 is depicted. In particular right load terminal current transformer spout bushing 32A, central load terminal current transformer spout bushing 32B, and left load terminal current transformer load spout bushing 32C are arranged side by side in an aluminum support piece 74. In particular right load terminal spout support piece flange 77A, central load terminal spout support piece flange 77B, and left load terminal spout support piece flange 77C are secured against the aluminum support piece 74 by way of a stress shield-to-aluminum support piece connecting bolt 75. Consequently, it can be seen that there is electrical continuity for each spout bushing 32A, 32B, and 32C through its spout stress shield lead wire 67 from the stress shield 64 to the aluminum piece 74 by way of the connecting bolts 75. Aluminum support piece 74 is affixed to right support piece-to-side wall spacer 76R on one side and left support piece-to-side wall spacer 76L on the other side by way of support piece-to-side wall spacer fasteners 80. In turn the right side wall spacer 76R and left side wall spacer 76L are affixed, respectively, to switchgear cabinet right side vertical wall 70R and left side vertical wall 70L by way of appropriate side wall spacer-to-switchgear cabinet side wall vertical wall fasteners 82. In the depiction of FIG. 4 the three thusly aligned and arranged spout bushings 32A, 32B and 32C are firmly disposed in load compartment 14 between the aforementioned left vertical wall 70L and right vertical wall 70R beneath the horizontal separating shelf 72 between the central lower compartment and central upper compartment. In this embodiment of the invention or arrangement, it is to be noted that an intrinsic conductor-to-ground capacitance C1 exists between the bushing conductor 60 and the stress shield 64. This capacitance is coupled by way of an electrical connection from stress shield 64 through spout stress shield lead wire 67, connecting bolt 75, aluminum piece 74, partial discharge sensor lead wire and current transformer primary winding 90 to ground G. The partial discharge sensor transformer secondary winding 92 is shown disposed in electromagnetic relationship with the primary winding 90. The function of this arrangement will be described hereinafter.

Figure 5:
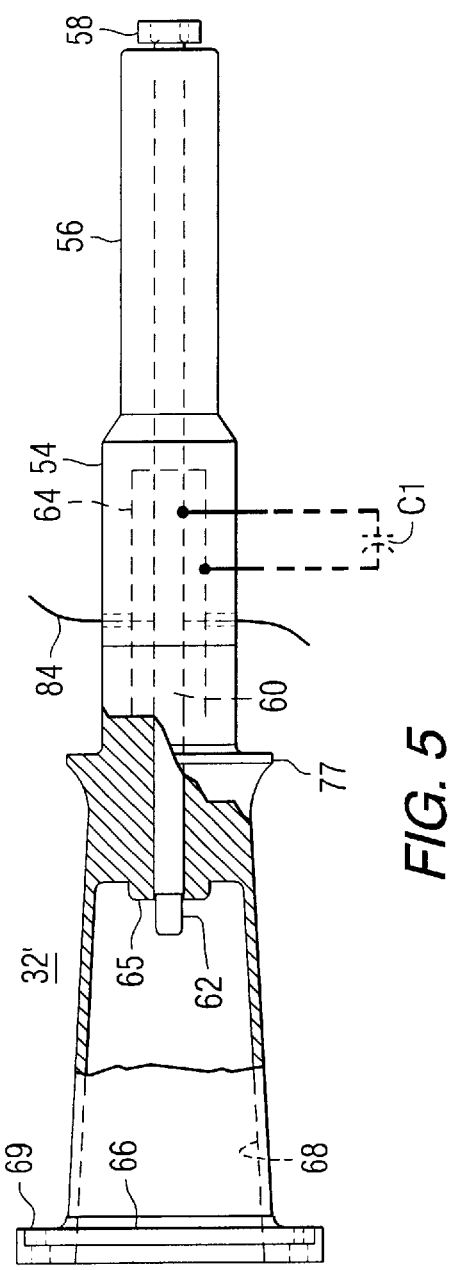
FIG. 5 depicts a side view of a spout similar to that shown in FIG. 2 but with shield access conductors present.
Figure 6:
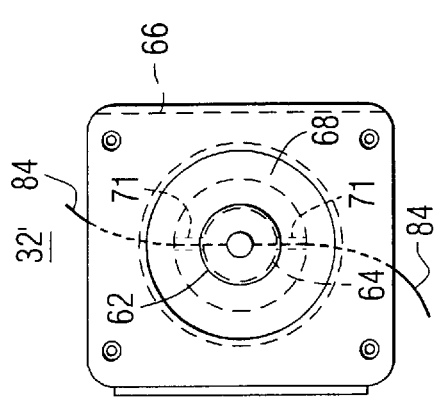
FIG. 6 depicts a front view of a spout of FIG. 5 similar to that shown in FIG. 3.
Figure 7:
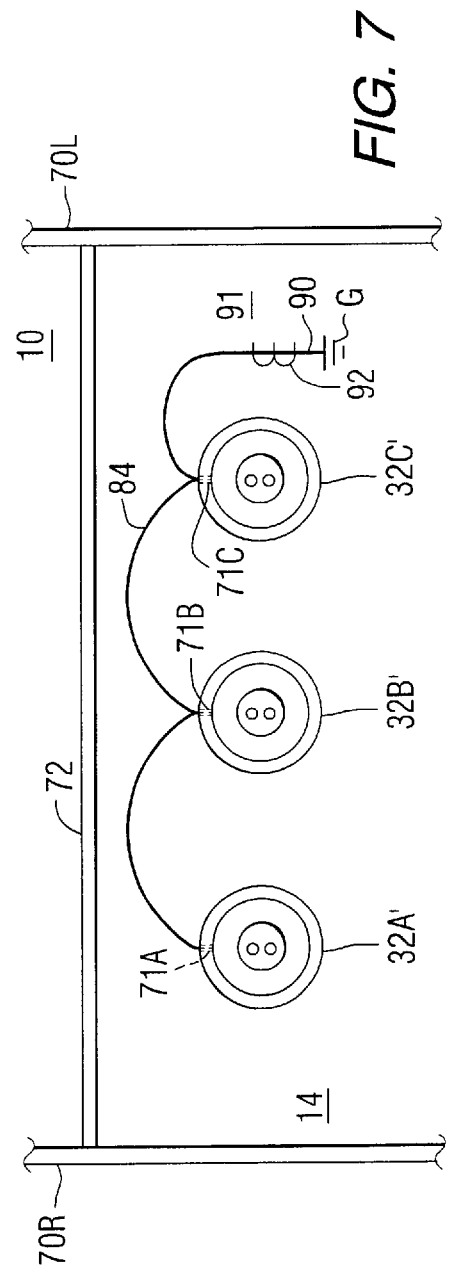
FIG. 7 depicts a rear view similar to that shown in FIG. 4 of three of the spouts of FIG. 5 disposed in an arrangement for partial discharge monitoring.

Referring now to FIGS. 5–7 as well as FIG. 1 another embodiment of the invention or arrangement is shown. In this embodiment of the invention or arrangement a load terminal CT spout bushing with stress shield lead wire 32' which is very similar to load spout bushing 32 is depicted. The embodiment or arrangement of FIGS. 5–7 is similar to the embodiment or arrangement of FIGS. 2–4, respectively, except for the interconnection between the shield 64 and the region external to the spouts 32 or 32' as the case may be. With regard to FIGS. 5–7 those features of the embodiment which are the same as the features depicted in the embodiment represented in FIGS. 2–4 are identified by similar reference characters. With respect to the embodiment or arrangement of FIGS. 5–7 there is provided a bushing hole 71 for load terminal CT spout bushing voltage stress shield lead wire radially disposed in the wider cylinder 74 to provide a clear path between the shield 64 and the external surface of the wider cylinder 54. An electrical conductor 84 or a stress shield lead wire for load terminal CT spout bushing is electrically affixed to the shield 64 and fed through the opening 71 and interconnected externally of the right spout bushing with lead wire 32A', central spout bushing with lead wire 32B', and left spout bushing with lead wire 32C' and then transformer primary winding 90 and ground G. The electrical current provided therein is monitored by the secondary winding 92. Consequently, it can be seen that the three aligned spout bushings 32A', 32B', and 32C' have right bushing hole 71A, central bushing hole 71B and left bushing hole 71C, respectively, through which the various interconnecting wires 84 feed to the various shields 64.

Referring now to FIGS. 8–10 as well as FIG. 1 an arrangement for the line terminals for a switchgear cabinet apparatus or system 10 with top entry line buses is depicted. In this embodiment of the invention or arrangement the switchgear arrangement maybe similar to that shown in FIG. 1, except that the electric line terminals resident in line compartment exit the switchgear from above rather than from the side as depicted in FIG. 1. In this embodiment of the invention or arrangement like reference characters represent like elements of the embodiments or arrangement. In this embodiment of the invention or arrangement there are provided two kinds of line vertical bushing breaker terminals. There is provided the non-offset vertical bushing 44 shown in FIG. 8 and the left offset vertical bushing 42B shown in FIG. 9. Left offset vertical bushing 42B shown in FIG. 9 may be reversed to form a right offset vertical bushing 42A as will be described with respect to FIG. 10. Non-offset vertical bushing 44 includes an upper vertical bushing portion 45 and a line current transformer spout non-offset vertical bushing main conductor 52 traverses through the axial center of the non-offset vertical bushing 44. The main conductor 52 protrudes outwardly from the bottom of the bushing casing to form a line current transformer spout non-offset vertical bushing breaker terminal 86 and protrudes outwardly upwardly from the top of the bushing casing to form a line current transformer spout non-offset vertical bushing line terminal 88. The upper vertical bushing portion 45 has disposed therein, circumferentially surrounding the axial line CT spout non-offset vertical bushing main conductor 52, a line transformer spout stress shield 95 which is interconnected electrically to a line contact spout stress shield external terminal 93. Intrinsic capacitance C1 exists between the shield 95 and the line current transformer spout non-offset vertical bushing main conductor 52.

Referring to FIG. 9, a left offset vertical bushing 42B similar to non-offset vertical bushing 44 is depicted. In this embodiment of the invention or arrangement, similar reference characters represent identical or similar portions of the two bushings 42B and 44. The upper vertical bushing portion 45 of the left off-set vertical bushing 42B is identical to the upper vertical bushing portion 45 of the non-offset vertical bushing 44 of FIG. 8. The similarity is existent from the CT line spout non-offset line terminal 88 in FIG. 8 and the CT line spout offset line terminal 88A in FIG. 9 downwardly to the stress shield external terminals 93. From there downward the arrangements vary. In the embodiment of FIG. 9 the left offset line main conductor 87B has two angled bends therein thus offsetting the line CT spout offset line terminal 88A from the left offset line breaker terminal 86B.

Referring, now to FIG. 10, the line compartment 15 of the top entry switchgear 10' with the various line terminals in place is depicted. In the center is disposed the non-offset vertical bushing 44. Disposed above and the left thereof as viewed in FIG. 10 is the left offset vertical bushing 42B and disposed to the right and lower thereof as viewed in FIG. 10 is the right offset vertical bushing 42A. Disposed on the left as shown in FIG. 10 is the vertical separating panel 73 between the circuit breaker compartment and the central lower and upper compartments. Panel 73 is attached at one end to the central upper compartment left side wall 100 and at the other end to the central upper compartment right side wall 102, these side walls 100 and 102, extend at right angles from the vertical separating panels 73. Each of the vertical bushings 42A, 42B and 44 are interconnected by way of line current transformer spout stress shield external terminal connecting bars 96 which are interconnected electrically with the stress shield electrical terminals 93 in each case. The right offset vertical bushing 42A is interconnected with right side wall 102 by way of a right side wall to flange insulating spacer 94R. The left offset vertical bushing 42B is interconnected with left side wall 100 by way of a left side wall-to-flange insulating spacer 94L. Therefore, it can be seen that there is electrical continuity between all of the line spout stress shields 95 by way of the terminals 93 and the external terminal connecting bars 96. The transformer primary winding 90 is interconnected with one of the common terminals 93 and ground G. The secondary winding 92 is disposed in proper electromagnetic relationship with the primary winding 90 as was discussed previously.

Figure 11:
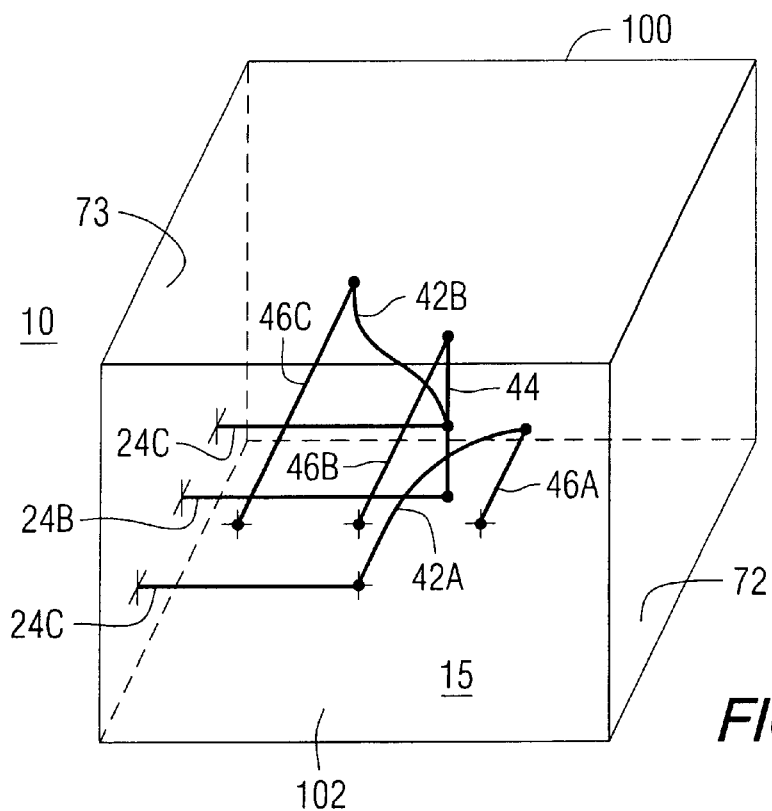
FIG. 11 is a schematic, mechanical diagram of a line conductor wiring arrangement similar to that shown in FIG. 1.
Figure 12:
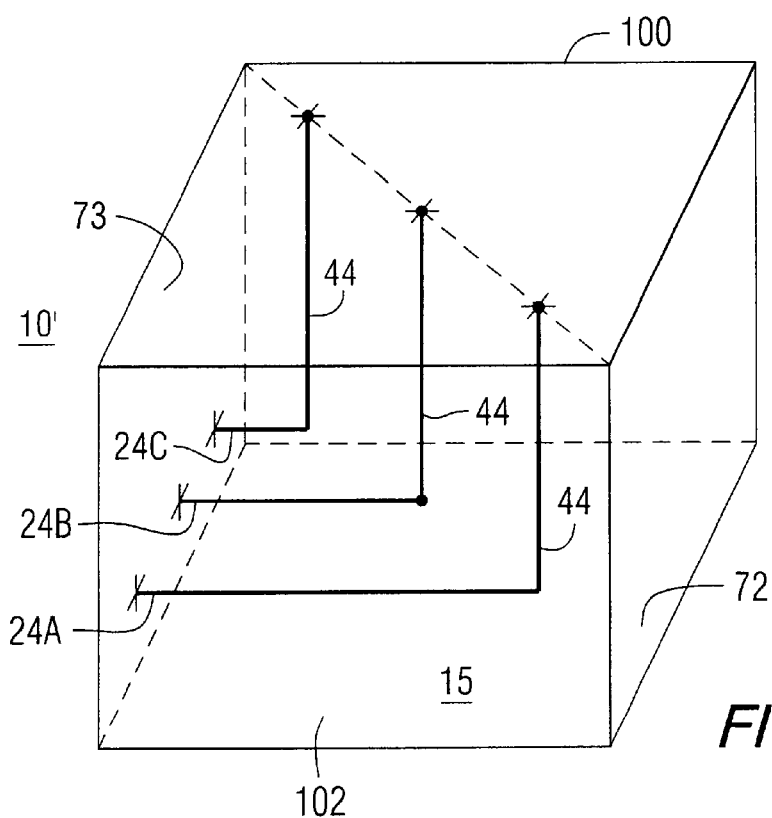
FIG. 12 shows an alternate arrangement for the line conductor terminals depicted in FIG. 11.

Referring now to FIGS. 11–12 as well as FIG. 1, the mechanical schematic arrangement of two possible line terminal layouts are depicted. FIG. 11 schematically represents the embodiment set forth in more detail in FIG. 1 shown in the side entry switchgear 10. FIG. 12 schematically reflects the top entry switchgear embodiment 10'. In both FIGS. 11–12, as well as FIG. 1, like reference characters represent like features. In each case, on the left the vertical-separating panel 73 is shown. Beneath that in each case is the horizontal-separating shelf 72. The closest side represents the right side wall 102 and the furthest side represents the left side wall 110. Together these planes form part of a rough cube corresponding generally schematically to the line compartment 15. In each case, schematically represented right side terminal bushing 24A, central terminal bushing 24B and left side terminal bushing 24C are shown exiting the vertical separating panel 73 into the volume of the line compartment 15. In the embodiment or arrangement of FIG. 11, the non-offset vertical bushing 44 is shown rising vertically from the end of central terminal bushing 24B, right offset terminal bushing 42A is shown rising vertically, and offset somewhat to the front from left terminal bushing 24C, and right offset vertical bushing 42A is shown rising vertically, and somewhat to the rear from the right terminal bushing 24A. Interconnected with left offset vertical bushing and extending outwardly therefrom is left line bus 46C. Interconnected with non-offset vertical bushing 44 and extending outward therefrom and in the same direction is central line bus 46B. Extending from right offset vertical bushing 42A is right line bus 46A. Line buses 46A, 46B and 46C extend outwardly through right side wall 102 as depicted at 88 for example in FIG. 1. With respect to the embodiment or arrangement of FIG. 12, three identical non-offset vertical bushings 44 may extend upwardly at right angles from the right side terminal bushing 24A, central terminal bushing 24B and left side terminal bushing 24C, respectively, to the line at terminals across the diagonal of the top part of the cube representing line compartment 15. Either one embodiment or arrangement or the other may be favored depending upon the needs of the user of the switchgear equipment. Both embodiments or arrangements are amenable to being utilized in the partial discharge diagnostic techniques to be described hereinafter.

Figure 13:
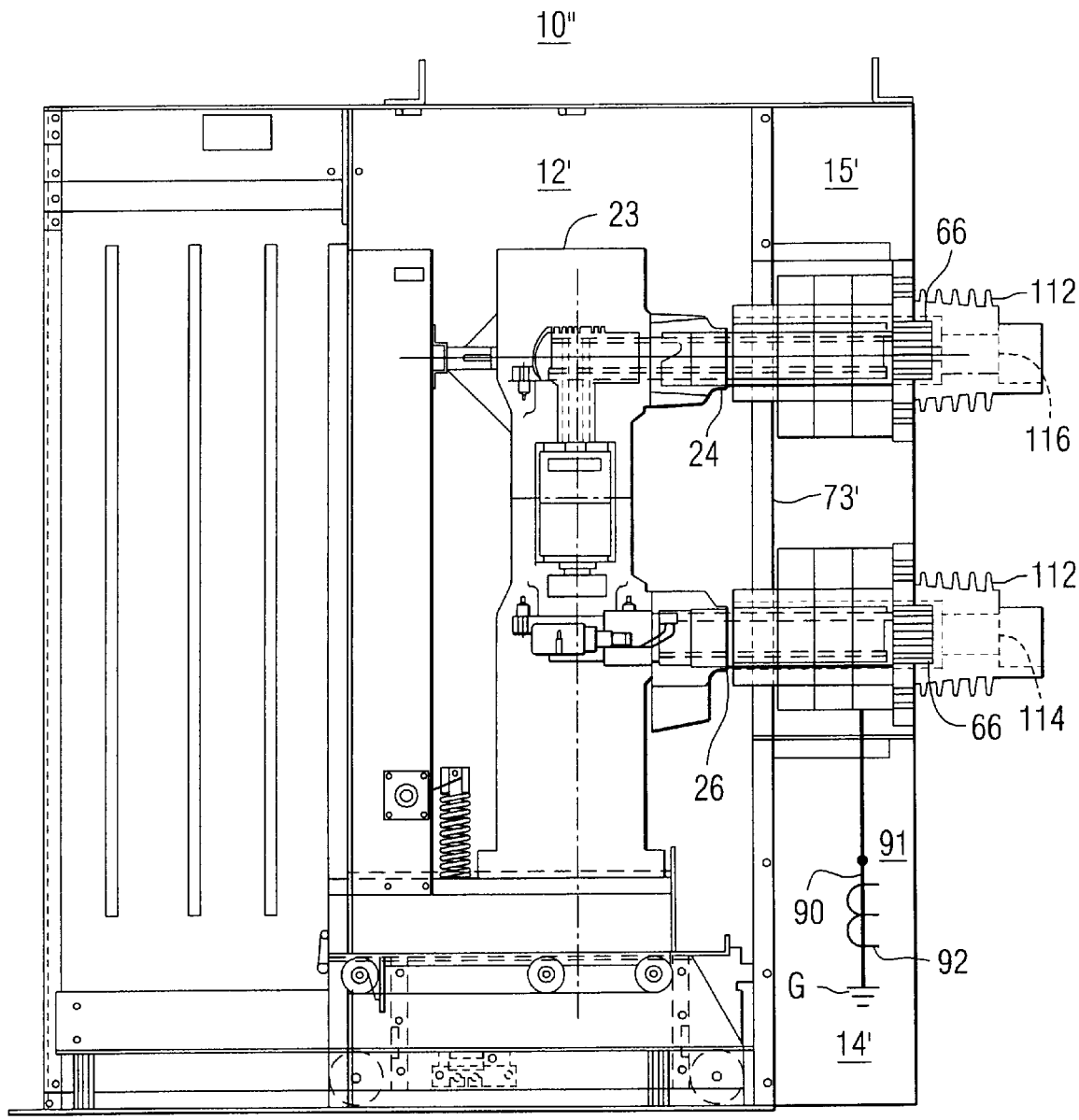
FIG. 13 shows an elevation, cut away and in section of an alternative switchgear utilizing current transformer bottles.

Referring now to FIG. 13, still another embodiment of the invention is depicted. FIG. 13 shows a side elevation, partially broken away, of short switchgear cabinet apparatus or system with rear entry line buses 10". Switchgear 10" includes a short switchgear cabinet front compartment 12" in which is disposed the circuit breaker 23 as was described previously. As was described previously, circuit breaker 23 has a line side terminal bushing 24 and a load side terminal bushing 26 located one above the other. These bushings protrude through a vertical separating panel 73' between the circuit breaker compartment 12' and the line and load terminal regions 15' and 14' respectively of the short switchgear cabinet. Mounted on the short switchgear vertical separating panel 73' are current transformer terminal bottles 112. The upper one represents the line terminal bottle and the lower one represents the load terminal bottle. Terminal bottles 112 are described hereinafter in greater detail with respect to FIGS. 15–16. Sufficed to say at this time that circuit breaker line or load terminal arrays 66 interconnect in a convenient manner with current transformer terminal bottle load terminal 114 and current transformer terminal bottle line terminal 116 in a manner to be described hereinafter. The region to the right of the short switchgear vertical separating panel 73' within the switchgear cabinet 10" is the line terminal region 15' at the top and the load terminal region 14' at the bottom. There may be disposed in the terminal region 14' the transformer primary winding 90 as interconnected with Ground G and as electromagnetically interacted with secondary winding 92 to assist in a partial discharge diagnosis in a manner which will be described hereinafter.

Referring now to FIGS. 14–17 as well as FIG. 13 the latter embodiment of the invention or arrangement will be described in greater detail. In particular, the terminal bottle 112 has a bottle load or line terminal 114 or 116 as the case may be. It is to be understood that an identical bottle may be used for either load terminal or line terminal operation. There is a central conductor 120 which has on the right the load or line terminal 114 or 116 and on the left the current transformer terminal bottle circuit breaker connecting stub 122. Disposed in the face of the bottle load terminal 114 or bottle line terminal 116 are convenient current transformer bottle bus connector threaded holes 121. There is provided at the end right of the bottle, a bottle bus connector lip 123. There is also provided intermediate the main body of the terminal bottle 112 a terminal bottle flange 124. Forward of that and circumfrentially disposed around the conductor 120 are terminal bottle insulator rings 125 which provide the normal high voltage insulating function. There is provided on the main body, a body outer voltage stress shield 126 on the outer surface thereof and a body intervoltage stress shield 127 on the inner surface of the shell-inside wall 128. The breaker terminal connector arrays 66 circumfrentially attaches itself to the bottle connecting stub 122 when the circuit breaker 23 is completely operationally inserted into short switchgear cabinet 10". This provides a circuit breaker connection between the line terminal 112 and load terminal 114. There are provided in the bottle flange 124, bottle outer voltage stress shield flange terminals 130 which are electrically interconnected with the bottle outer stress shield 126. In this embodiment of the invention or arrangement the intrinsic capacitance C1 exists between the bottle inner stress shield 127 (and the bottle central conductor 120 which is electrically connected thereto) and the outer bottle stress shield 126. In the embodiment or arrangement shown in FIG. 17, the tiered arrangement of three sets of bottle load terminals and bottle line terminals are shown. There is depicted on the left, the short switchgear right wall 140 and on the right the short switchgear left wall 138. On the bottom aligned in a tier are the right bottle load terminal 114A, the central bottle load terminal 114B and the left bottle load terminal 114C. Aligned on the top in a similar manner are the right bottle line terminal 116A, the central line bottle terminal bottle 116B and the left line bottle terminal 116C. These are all disposed in a short switchgear insulating support 136. On the top, the terminals 130 are electrically joined together by a connector strap 142 for the flange terminals. The flange connector strap 142 is interconnected with the transformer primary 90 and thence to Ground G as was the case previously. The transformer secondary winding 92 is electromagnetically interconnected with transformer primary winding 90.

Figure 18:
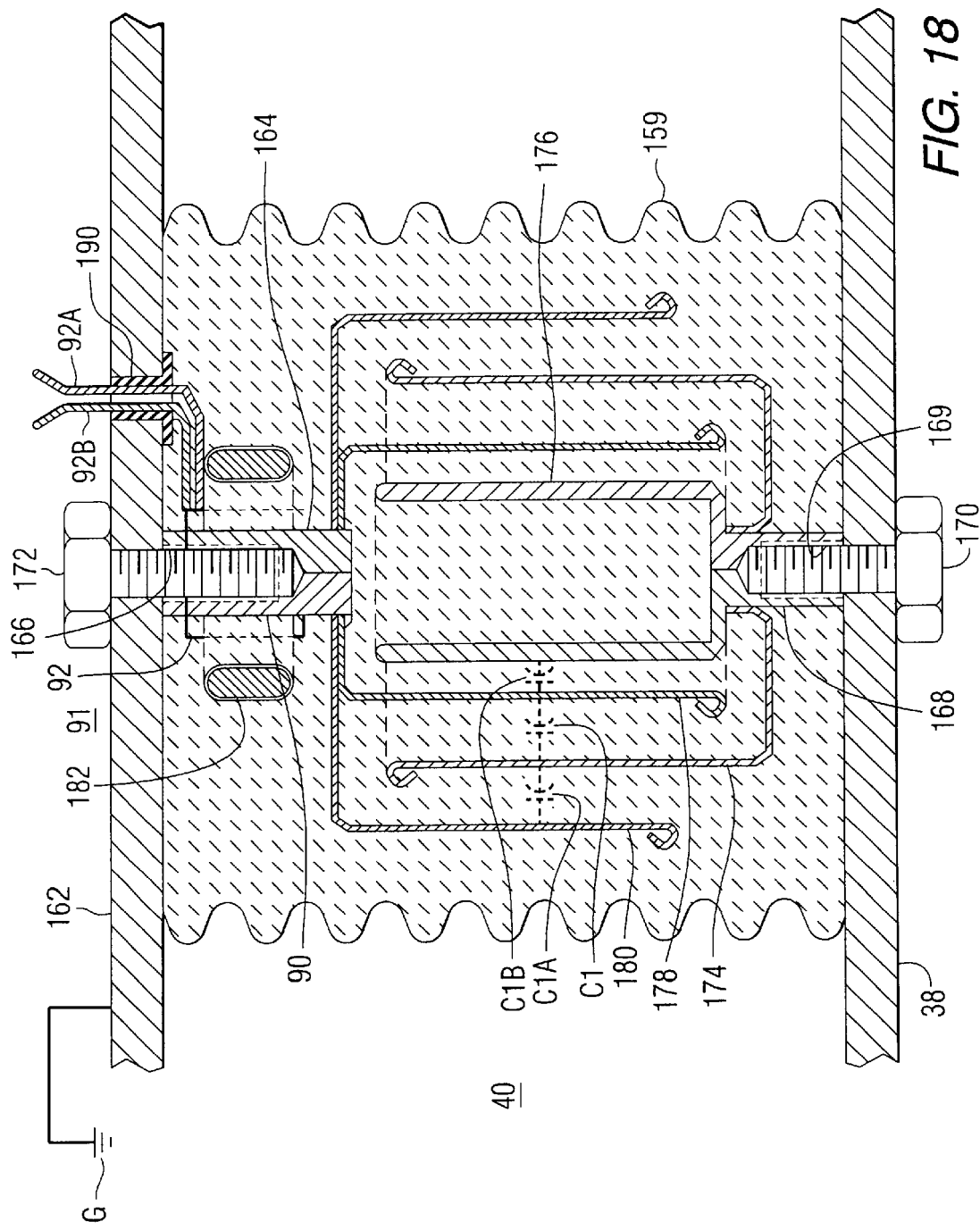
FIG. 18 shows a stand-off insulator similar to that depicted in FIG. 1 in elevation and in section depicts internal partial discharge sensor elements.

Referring now to FIG. 18 a standoff insulator 40 such as the one shown in FIG. 1 is depicted again. In particular, standoff insulator 40 may comprise molded epoxy insulating material 159 in which are moldingly disposed concentric shells. Resins or other suitable molding materials may be used for the insulating material 159. There may be a larger high voltage outer shell 174 concentrically disposed about a higher voltage inner shell 176 both of which are axially aligned with and concentrically attached to a conductor to bus support member 168. The concentric arrangement is not limiting. Conductor to bus support member 168 may have axially disposed therein a threaded opening 169. Threaded opening 169 communicates or connects with an external portion of the insulating material 159 at the bottom of standoff insulator 40 as viewed in FIG. 18. Axially aligned with the latter arrangement and coaxially interleaved therewith may be a smaller grounded inner shell 178 and a larger grounded outer shell 180 both of which are joined at the root to an axial conductor to frame support member 164. Conductor to frame support member 164 or grounded support member as the case may be may include therein a threaded opening 166. Conductor to frame support member 164 communicates within an external portion of the insulating material 159 at the top of the standoff insulator 40 as shown in FIG. 18. As shown in FIG. 1 and depicted again in broken off section in FIG. 18 there may be provided a conductor bus standoff insulator support member 162 which supports the standoff insulator 40 by way of a support base to insulator support member fastener 172 which captures support member 162 and impresses it against the top of the insulator 40 as member 172 is threaded into the threaded opening 166. In a like manner, on the bottom of insulator 40, load bus 38 is captured between the head of a conductor bus to conductor bus support fastener 170 and the bottom surface of the standoff insulator 40 as the threaded member 170 is threaded into threaded openings 169. In this embodiment of the invention therefore the standoff insulator 40 spaces the insulator supports base 162 from the load bus 38 and supports the load bus 38. In addition, in the present embodiment of the invention the insulator member 40 may perform another function and that is to act as a partial discharge sensor member. In particular, conductor to frame support member 164 acts as the transformer primary winding 90 in a manner which was described previously. This member is electrically interconnected with the support member 162 which in turn is Grounded at G. Surrounding the transformer primary winding 90 is the transformer secondary winding 92. Electromagnetic interaction between the primary 90 and the secondary 92 is enhanced by the presence of a ferrite current transformer core 182. The secondary winding wires 92A and 92B, also depicted in FIG. 26, as will be described hereinafter exit the epoxy insulating material 159 through a grommet 190 which may feed through the support member 162. By observation of the arrangement of the interleaved concentric plates in the insulator 40, it can be seen that at least three regions of intrinsic capacitance exists. One region of intrinsic capacitance C1 exists between plate 178 and plate 174 another region of intrinsic conductor-to-groundcapacitance C1A exists between the two outer shells 174 and 180 and still another intrinsic capacitor-to-ground capacitance C1B exists between the inner shells 178 and 176. All of this capacitance combines electrically to form the total capacitance that is necessary and required to perform the partial discharge sensing and monitoring function. It is to be understood that the foregoing arrangement is not limited to one with a bus, a wire or cable may be used instead.

Figure 19:
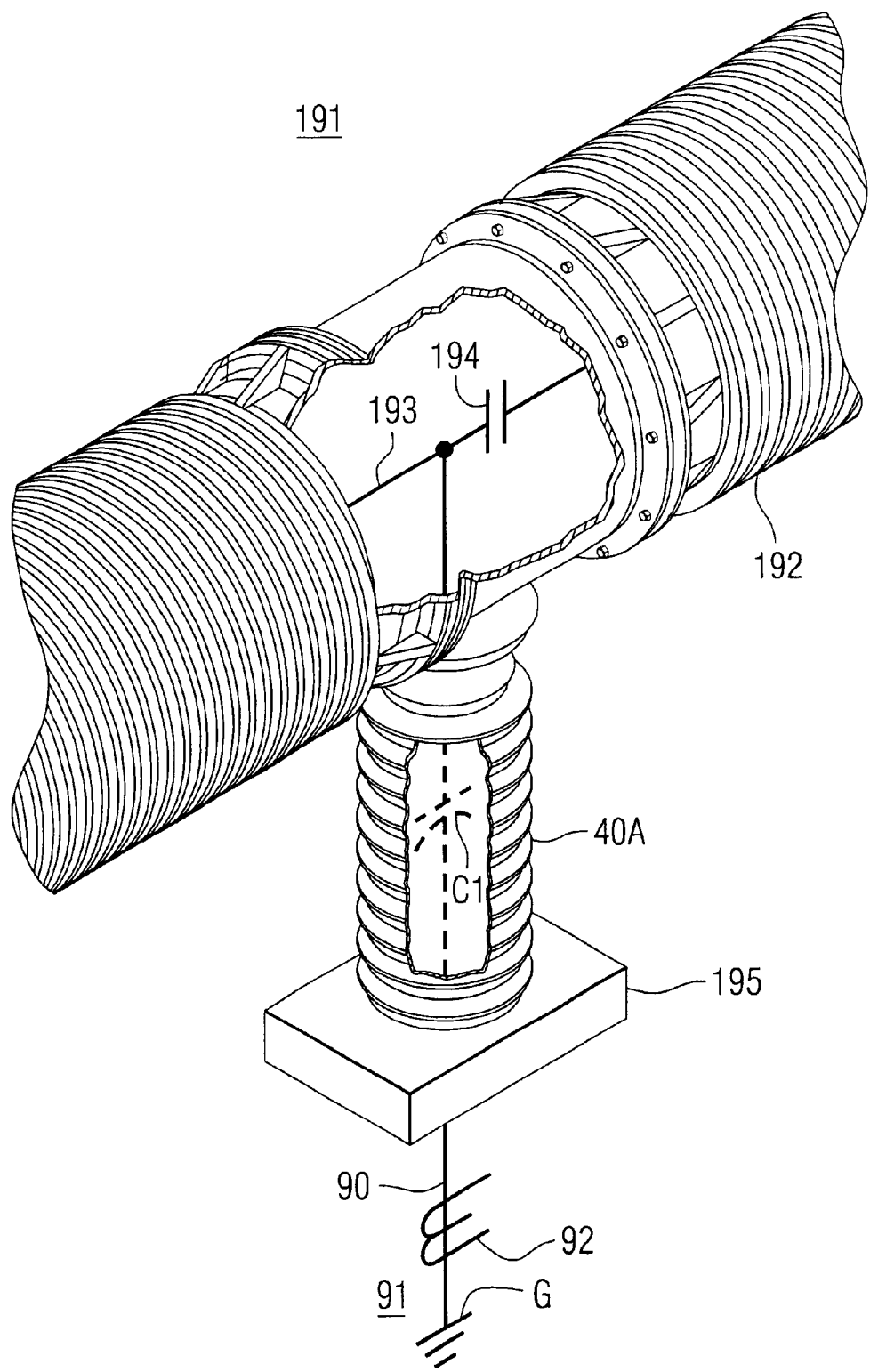
FIG. 19 shows an orthogonal view, partially broken away of a horizontal circuit breaker utilizing the teachings of the current invention.

Referring now to FIG. 19, there is shown another arrangement. In particular, a horizontal, large air circuit breaker system or apparatus 191 is shown which is spaced apart from a large air circuit breaker air standoff insulator base 195 by a circuit breaker standoff insulator with partial discharge sensor 40A. Horizontal breaker 191 includes a circuit breaker casing 192 and a main conductor 193 which is axially intermediate the casing 192. There may be provided in a hollow recess in the casing 192 a set of separable contacts 194. The intrinsic capacitance C1 in the standoff insulator 40A between the main conductor 193 and Ground G may feed through the transformer primary winding 90 for magnetic interaction with the transformer secondary winding 92.

Figure 20:
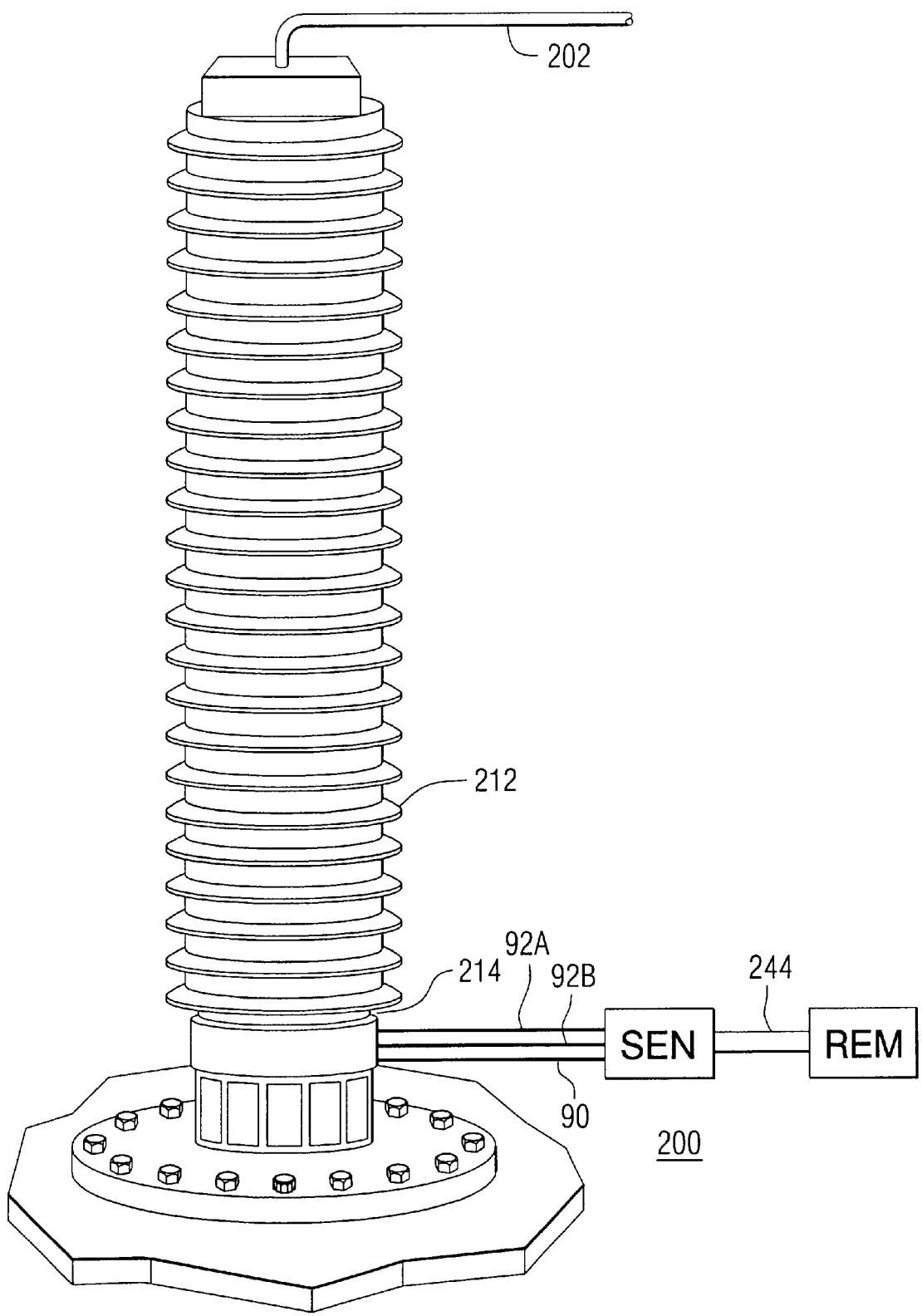
FIG. 20 shows an orthogonal view of a transformer utilizing a bushing, which maybe utilized for partial discharged sensing.

Referring now to FIG. 20 a high voltage transformer 200 is shown which provides power to a high voltage power line 202 by way of a high voltage transformer terminal bushing 212 and through a high voltage current transformer 214. High voltage transformer current transformer secondary winding leads 92A and 92B are shown feeding schematically outwardly from the high voltage transformer current transformer 214 to a high voltage transformer partial discharge sensor SEN which may provide dual signals on cable 244 to remote monitor REM in a manner to be discussed hereinafter. Lead 90 is also shown.

Figure 27:
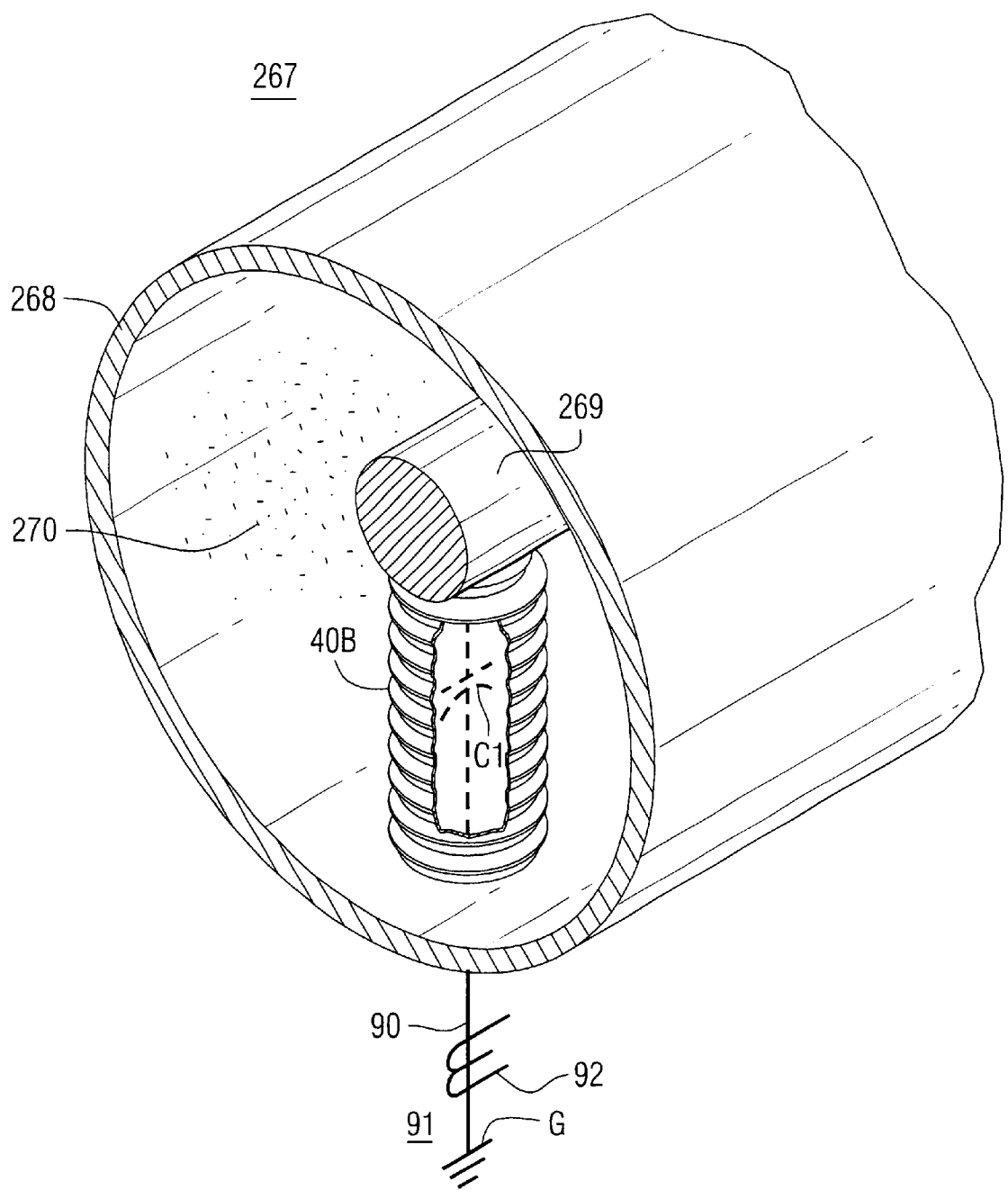
FIG. 27 depicts an orthogonal view, partially broken away of a gas insulator conductor system.

Referring now to FIG. 27 still another arrangement is shown in which a gas insulator or insulated conduction section system or apparatus 267 is shown. Section 267 comprises a generally circular cylindrical casing 268 in which is axially disposed and aligned a main conductor 269. Electrical insulating gas 270 insulates main conductor 269 from the gas insulated casing 268, which may, in one embodiment of the invention, be grounded. The insulating gas 270 may comprise sulfur hexafluoride or a similar insulating gas. A standoff insulator with partial discharge sensor 40B may be provided between the main conductor 269 and the casing 268 to support the main conductor 269 within the 268 casing. Within the body of gas insulated standoff insulator 40B resides the intrinsic capacitance C1 which is interconnected with the gas insulated casing 268 from whence the primary transformer winding 90 is interconnected with Ground G. The primary transformer winding 90 is electromagnetically interconnected with the secondary winding 92 in a manner described previously.

Figure 21:
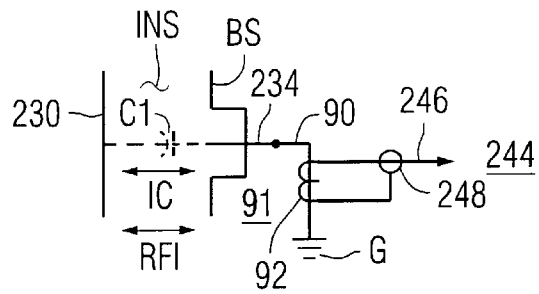
FIG. 21 shows prior art schematic diagram of a partial discharge sensor and monitor.

Referring now to FIG. 21, a prior art, circuit of a sensor employing a current transformer is shown. The bushing tap 234 is permanently grounded at the vicinity of the tap location, and the primary winding 90 of the current transformer 91 is formed by the grounding conductor (singleturn winding). The power frequency signal IC or radio frequency signal RFI arrives to the tap 234 through the capacitance C1 formed by the current carrying parts of the bushing conductor 230, the bushing shield BS and the bushing insulation INS connected with the tap. The signal then travels to the ground, through the primary winding 90 of the current transformer 91. Conductor 230 represents a high voltage conductor of the type which may be found in FIGS. 1, 13, 19, 20 or 27. The current transformer secondary winding 92 consisting of several turns, depending on the required sensitivity, is connected with the connecting circuit 244 (usually a coaxial cable or twisted pair cable) that transmits the signal to remote measuring equipment.

Figure 22:
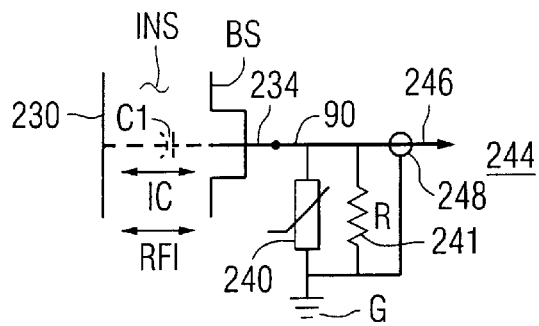
FIG. 22 sows another embodiment of a prior art partial discharge sensor and monitor FIG. 23 still another embodiment of a prior art partial discharge senso[00f8] and monitor.

Referring now to FIG. 22, a prior art sensor for measuring power frequency capacitive current through a bushing, employing a resistor shunt 241 is shown. A capacitive tap 234 is connected through the resistor shunt 241 and a surge arrester or varistor 240 in parallel, to the Ground G in the vicinity of the tap location. The connecting circuit (usually a control or coaxial cable, or a twisted pair cable) 244 carries the signal to remote measuring equipment (not shown). The resistance R of the shunt resistor 241 is chosen to limit the power frequency voltage at the output of the tap to a safe value in the event of accidental circuit opening, such as a disconnecting of the measuring equipment at the remote end of the circuit or an open-circuit fault. The surge arrester 240 limits the tap-to-ground voltage to a safe level with respect to the tap and the measuring circuit insulation, in the event of occurrence of switching and lightning overvoltages originated in the primary circuits.

Figure 23:
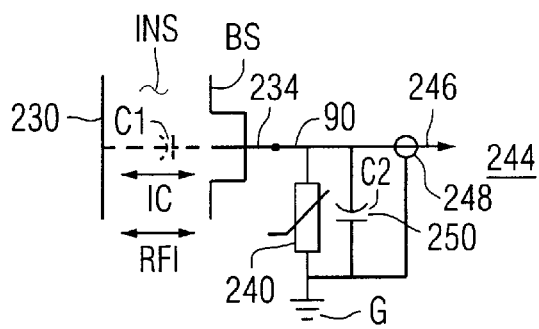

A prior art sensor designed to measure capacitive current through the bushing insulation at power frequency employing a capacitor shunt 250 is shown in FIG. 23. This circuit is identical to the circuit of FIG. 22, except that the resistor shunt 241 is substituted with a capacitor shunt 250 of capacitance value C2. Thus the voltage divider C1–C2 has a ratio practically independent of frequency. The value C2 of the capacitor 250 is chosen to limit both the power frequency voltage and the switching and lightning impulses to a safe level with respect to the tap and the measuring circuit insulation. The surge arrester 240 is installed as a second line of defense.

Figure 24:
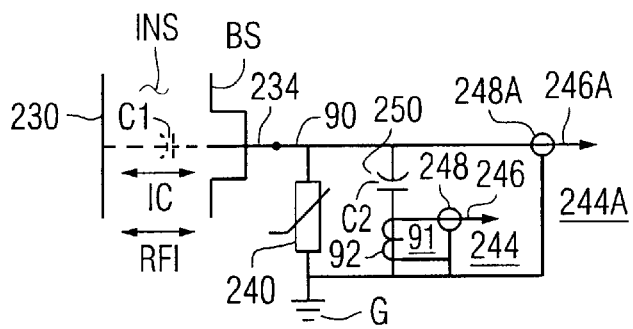
FIG. 24 shows still another embodiment of a prior art partial discharge senso[00f8] and monitor.

A prior art sensor to measure both the radio frequency impulses and the power frequency capacitive current of the bushing is shown in FIG. 24. Two separate circuits or cables carry the measured signals to the remote recording instrumentation (not shown). The surge arrester 240 and the capacitor shunt 250 are connected in parallel between the capacitance tap 234 and the Ground G, as in the circuit of FIG. 23. The primary winding of the radio frequency current transformer 91, in the form of a single turn, is inserted between the capacitor shunt 250 and the Ground G. The secondary winding 92 of the current transformer 91 is connected to the connecting circuit 244. The shield of the circuit and the respective end of the secondary winding 92 are grounded at the tap location. The second connecting circuit 244A carries the power frequency signal in a manner similar to the circuit described in FIG. 23. The sizing requirements for the capacitor shunt 250 and the surge arrester 240 are identical to that of the circuit of FIG. 23.

Figure 25:
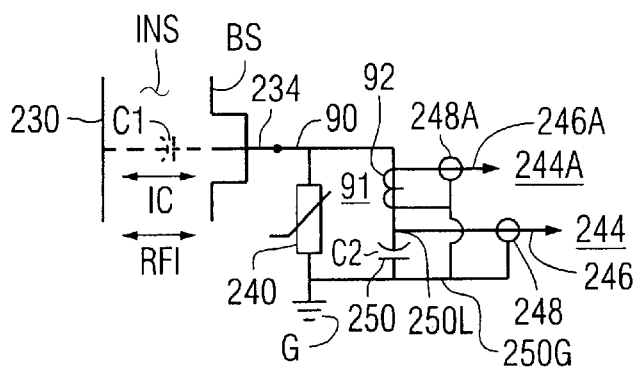
FIG. 25 shows still another embodiment of a prior art partial discharge senso[00f8] and monitor.

FIG. 25 represents a prior art sensor similar to the sensor of FIG. 24, except that the primary winding 90 of the radio frequency current transformer 91 is located on the "live" side of the capacitor shunt 250 instead of its grounded side.

Figure 26:
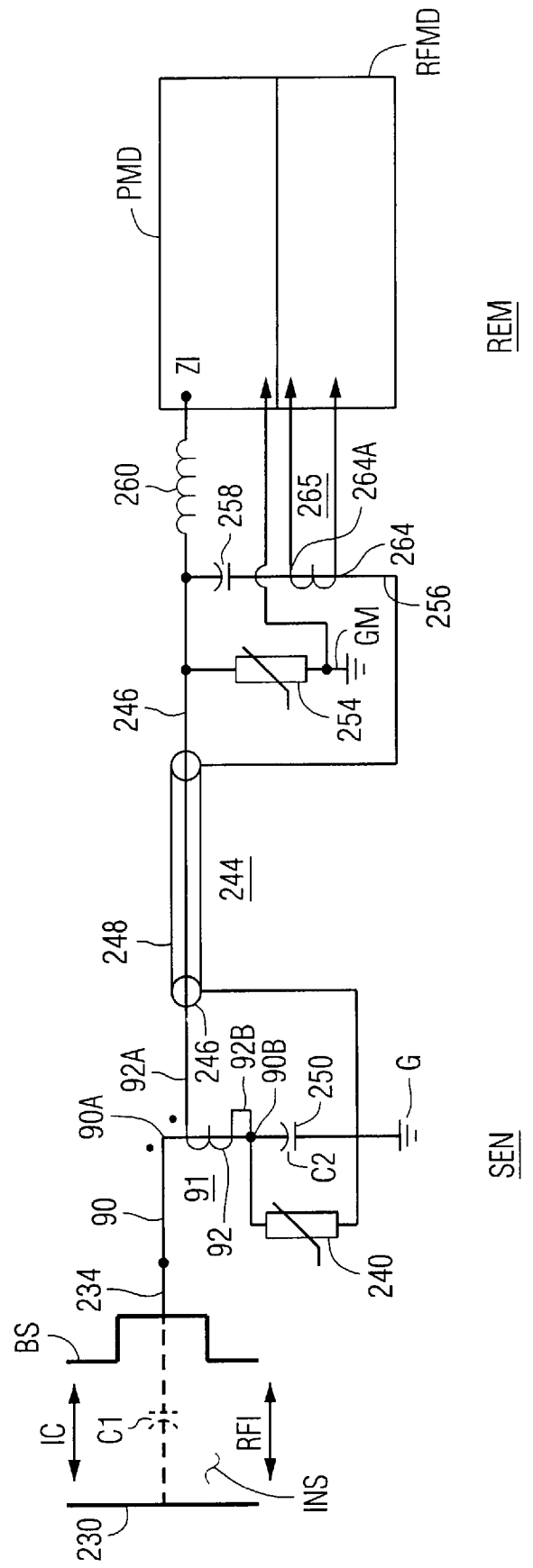
FIG. 26 shows a partial discharge sensor, monitor and measuring currents embodying the teachings of the present invention.

An embodiment of the present invention which may be an integral part of any of the electrical systems or apparatus of FIGS. 1, 13, 19, 20 or 27 for example, is depicted in FIG. 26 and described hereinafter includes a sensor SEN that permits transmitting both the radio frequency and power frequency signals simultaneously using one connecting circuit as shown in FIG. 26. The connecting circuit 244 may be, for example, a coaxial or twisted pair cable. The capacitor shunt 250 and the parallel surge arrester 240 are connected to the non-polarity terminal 90B of the primary winding 90 of the radio frequency current transformer 91, while its polarity terminal 90A (*) is connected to the tap 234. The opposite terminals of the capacitor shunt 250 and the surge arrester 240 are grounded at G. The polarity terminal 92A of the secondary winding 92 of the current transformer 91 is connected to the signal conductor 246 of connecting circuit 244, while the second conductor 248 (for example, the shield of a coaxial cable), is grounded at G at the tap or local location. The opposite (non-polarity) terminal 92B of the secondary winding 92 of the current transformer 91 is joined with the non-polarity terminal 90B of the primary winding 91.

An input circuit for the remote measuring device REM for the sensor signal is also shown in FIG. 26. To prevent circulation of induced currents in the second conductor 248 of the connecting circuit 244 this conductor 248 is ungrounded at the instrumentation REM end. An additional surge arrester 254, preferable of identical rating to the one, 240, in the sensor SEN, is placed between the signal conductor 246 of the connecting circuit 244 and the remote ground GM for added protection and safety. The power frequency measuring/record device PMD is connected across the additional surge arrester 254 via a small inductance 260. The size of the inductance or choke 260 is chosen such that the power frequency signal is let through, while the radio frequency signal is blocked. The induced current in the loop created by the signal conductor of the connecting circuit 244, the capacitor shunt 250 in the sensor SEN and the input impedance ZI of the measuring/recording device PMD, as well as the noise level on the input, are reduced by the choice of the capacitance C2 for the capacitor shunt 250. Radio frequency measuring/recording equipment RFMD is connected across the secondary winding 264A of radio frequency isolating transformer 264. The primary winding 256 thereof is connected in series with capacitor 258 and inserted between the signal conductor 246 and the second conductor or shield 248 of the connecting circuit 244. The capacitor 258 cuts off the power-frequency signal and narrows the band of the radio frequency signal let through.

Referring to the prior art circuit of FIG. 21, the power frequency capacitive current IC flows through the capacitance C1 of the bushing insulation BS to the Ground G, with a relatively small voltage drop across the primary winding 90 of the current transformer 91. The radio frequency electrical impulses RFI that accompany the partial discharges inside the bushing insulation BS travel the same path. The voltage drop from the power frequency signal IC as well as switching and lightning impulses is usually small in this type of a sensor, thus there is no need for any additional overvoltage protection of the tap.

In the sensor designed to detect only a power frequency signal, the current transformer 91 is typically of an air core type (Rogovsky coil) with a linear response characteristic (output signal vs. input current magnitude). The capacitive current through the insulation is typically in the order of 5–100 aM rms, depending upon the capacitance of the insulation C1 and the rated voltage. If the Rogovsky coil design is employed, its low sensitivity requires a measuring instrumentation of higher sensitivity. In the sensor designed to detect only the radio frequency impulses, the current transformer 91 is typically of a ferrite core type. A radio frequency signal RFI associated with partial discharges in the insulation yields very weak output signals (from microvolts of tenths of volt), also requiring more sensitive measuring instrumentation. In any of these two cases the connecting circuit 244 transfers the measured signal to the remote monitoring instrument (not shown). Although no additional overvoltage protection is necessary at the sensor location, it may be required at the measuring equipment.

In the prior art design of FIG. 22, a significant voltage drop is generated across the resistor shunt 241 by the power frequency capacitive current IC that flows through the bushing insulation. This voltage drop is transferred to the monitoring equipment (not shown) through the connecting circuit 244. If the input impedance of the remote measuring device is significantly lower than that of the shunt 240, the voltage drop is controlled by the input impedance of the instrumentation. The value of the resistance of shunt 240 is chosen such as to limit the power frequency voltage at the tap 234 to a safe value in the event of the monitoring device disconnection or accidental open circuit fault in the connecting circuit 244. When the input impedance of the remote instrumentation is comparable with the resistance of shunt 241, a precision resistor must be employed as it directly controls the accuracy of the measurement. Switching or lightning overvoltages that occur on the high voltage primary circuit are transferred to the output of the capacitor tap 234, their magnitude being controlled by the capacitive-resistive voltage divider. This divider consists of the bushing insulation capacitance C1 and the parallel combination of the resistance R of the shunt 241 and the surge resistance (not shown) of the connecting circuit 244. The divider ratio is frequency dependent; hence the high frequency transients from the high voltage primary circuits lead to very high transient voltages at the tap 234. To keep the voltages at the safe level, the surge arrester 240 is required. As switching and lightning overvoltages in a high voltage switchyard are relatively common, the arrester 240 duty is high. The thermal stability of the resistor shunt 241 has to be sufficiently high to survive the prolonged power frequency overvoltages resulting from open circuit faults in the connecting circuit 244. The dielectric strength of the resistive shunt 241 has to be coordinated with the residual voltage of the arrester 240.

In the prior art design of FIG. 23, the voltage divider consists of the bushing insulation capacitance C1 and the capacitor shunt 250 of capacitance C2. The voltage divider ratio is essentially independent of frequency; thus both the power frequency voltage drop and the voltage drop from switching and lightning transients can be reduced in the same proportion. As a result, transients are reduced to a much lower level than in the circuit of FIG. 22. The surge arrester 240 merely serves as a second line of defense, in the event of extremely severe overvoltages. In comparison with the circuit of FIG. 22, much less frequent operation of the surge arrester 240 is expected. To insure adequate accuracy and frequency response, a special impulse capacitor 250 should be used, of essentially constant capacitance over a wide range of frequencies, typically from 50 Hz to 1–10 MHz. The capacitor 250 should also feature high temperature stability. The capacitor shunt insulation has to withstand the maximum possible residual voltage of the surge arrester 240, a requirement similar to one for the resistive shunt 241 in the circuit of FIG. 22.

In the prior art designs of FIGS. 24 and 25, the principle of detection of the power frequency signal IC and the requirements for overvoltage protection of the tap insulation and the associated circuits are similar to the sensor of FIG. 23. Therefore, the same requirements apply for the selection of the capacitor shunt 250 and the surge arrester 240. Radio frequency impulses RFI associated with the partial discharges in the bushing insulation generate the radio frequency current impulses traveling through the bushing insulation capacitance C1 and the capacitor shunt 250. The higher the frequency of the current the lower the impedance of this circuit, hence steeper impulses of the same magnitude result in higher current magnitudes. Due to this phenomenon, even very weak high frequency signals can be successfully captured by the radio frequency current transformer 91 inserted in the circuit of the capacitor shunt 250. The impulses are conducted from the secondary winding 92 of the current transformer 91 to the connecting circuit 244A. In order to keep the power frequency voltages, as well as the switching and lightning overvoltages, within a safe limit and to ensure an optimal sensitivity of the radio frequency impulse detection, the capacitance C2 of the capacitor shunt 250 should be typically within 0.1–1 uF. Although functionally identical to the circuit of FIG. 24, locating the radio frequency current transformer 91 at the grounded end of the capacitor shunt 250, as in FIG. 25, is preferred for the safety reasons. The circuits for transmitting of the power frequency and the radio frequency signals are formed by two separate circuits (cables) 244 and 244A. This arrangement allows the use of a radio frequency monitoring equipment of high sensitivity while eliminating the potential of its damage by the power frequency signal.

The circuits of FIGS. 24 and 25 have two disadvantages. First, two circuits (cables) are required, complicating the sensor design. Second, the surge arrester (varistor) stray capacitance, being in parallel with the capacitance C2, in series with the impedance of the current transformer 91 (consisting of the current transformer inductance and its resistive load), causes diversion of a significant part of the high frequency current impulses from the current transformer 91 into the varistor 240. This phenomenon reduces the sensitivity of the sensor to current impulses, especially to the steep and short impulses associated with partial discharges, but can be saturated on long pulses.

With regard to what is shown in FIG. 26, the requirements for selection of the capacitor shunt 250 and the surge arrester (varistor) 240 are similar to those for the sensors of FIGS. 24 and 25. The power frequency current IC travels from the tap 234 into the primary winding 90 of the current transformer 91 and then into the capacitor shunt 250. The radio frequency current impulses RFI travel the same way. As the primary 90 and the secondary windings 92 of the radio frequency current transformer 91 have a common point at the capacitor shunt 250 "live" terminal 90B, the radio frequency signal induced in the secondary winding 92 becomes superimposed on the power frequency signal in the connecting circuit (cable) 244. These two signals have to be separated at the remote end REM of the connecting circuit.

The placing of the surge arrestor 240 in the circuit of FIG. 26 requires further clarification. The two methods of connecting the surge arrestor 240 represented by FIGS. 22–25 and FIG. 26, respectively, offer virtually an identical protection, as the impedance of the primary winding 90 of the current transformer 91 is effective only during a fraction of the impulse duration (usually no more than 50–100 ns), until the ferrite core (see 182 in FIG. 18 for example) of the current transformer 91 saturates. After the core has saturated, the transformer 91 input impedance drops to a negligible value, and the voltage at both ends of the primary winding 90 practically coincide electrically. The surge arrester 240 which is designed to absorb impulse currents in the order of hundreds to thousand amperes cannot provide an adequate protection during such short time intervals, i.e. it will be ineffective during first 50–100 ns, regardless of its connection to the tap output 234 or to the capacitor shunt 250. Consequently, in both discussed configurations, the sensor circuit SEN should be designed to withstand initial overvoltages as if no surge arrester 240 were present. It has been proven by test that with a proper design, these initial overvoltages can be confined to a level acceptable for both the capacitance tap insulation INS and the sensor components. After the initial time interval the overvoltage protection provided by the arrester 240 together with the capacitor shunt 250 is identical in both designs. But due to the placement of the surge arrester 240 after the primary winding 90 of the radio frequency current transformer, all impulse current flows through it, thus providing the maximum sensitivity of the sensor to the impulses created by partial discharges.

Locating the remote instrumentation REM far from the device being monitored may pose concerns. First, the difference in ground impulse potentials between the sensor SEN and measuring equipment REM locations during switching and lightning transients originated on the high voltage side of the equipment being monitored can distort the measurements or even damage the measuring devices. Second, power frequency currents induced in the loops including the connecting cable 244 can create an essential error in the measured values. For these reasons the input circuit of the remote measuring or recording equipment REM has to be coordinated with the sensor circuit SEN. FIG. 26 shows an 30 embodiment of an input circuit for the remote monitoring devices PMD and RFMD to be used with the sensor circuit SEN.

The second conductor (or shield) 248 of the connecting circuit 244 is left ungrounded at the remote end of the circuit, thus preventing the formation of a ground loop through this conductor (shield) 248. To provide safety and overvoltage protection, an additional surge arrester 254 is used as the part of the input circuit at the remote end REM of the connecting circuit 244 between the signal conductor 246 and the remote Ground GM. To reduce the possible induced current in the loop, created by the capacitor shunt 250 in the sensor SEN, the signal conductor 246 in the connecting circuit 244 and the input impedance ZI of the power frequency measuring/recording device PMP at the remote end REM, and especially the interference at the input of device PMD, some limitations have to be imposed on the choice of the capacitor shunt 250 in the sensor SEN. The impedance of the chosen capacitor shunt 250 at the power frequency has to be much higher than the input impedance ZI of the device PMD. High impedance in this loop reduces the magnitude of the current; and the voltage induced in the loop will be divided between this capacitor shunt 250 impedance and the input impedance of the instrumentation while most of the voltage will appear across the capacitor shunt 250 instead of the measuring device.

Power frequency and impulse signals transmitted via the single connecting circuit 244 from the sensor SEN have to be separated at the remote end REM to be fed into the proper measuring/recording instruments. The power frequency signal, related to IC, is obtained across the surge arrester 254 via a small inductance (choke) 260 that blocks the radio frequency signals from penetrating into the power frequency measuring/recording device PMD, but does not interfere with the power frequency signal. To satisfy the two requirements the inductance 260 is typically of the order 0.1–1 mH. To detect the radio frequency signals, related to RFI, a small capacitor 258 and the primary winding 256 of the radio frequency isolating transformer 265 connected in series are connected between the signal conductor 246 and the second conductor or sheath 248 of the connecting circuit 244. The high impedance of the small capacitor 258 at power frequency blocks the power frequency current from traveling to the remote Ground GM through the primary winding 256 of the radio frequency isolating transformer 265, thus only the radio frequency signals are detected at the transformer secondary winding 264 that the radio frequency measuring device RFMD is connected to. The impedance of the capacitor 258 has to be low at radio frequencies. To satisfy these two conditions the required capacitance is typically in the range of 1–10 nF. The capacitor 258 also limits the frequency band to assist in rejecting unwanted noise. The small capacitor 258 and the isolating radio frequency transformer 265 provide isolation between the radio frequency measuring/recording equipment RFMD and the remote end of the connecting circuit 244.

The sensor circuit SEN of FIG. 26 is capable of a simultaneous on-line detection of two separate signals reflecting the condition of the monitored high voltage apparatus insulation, namely, the power frequency capacitive current IC through the bushing insulation BS and the radio frequency current impulses RFI associated with partial discharges occurring inside the bushing insulation BS. Both signals are transmitted using a single connecting circuit (cable) 244, common to both signals, to the remote instrumentation REM where the signals have to be separated. The power frequency signal IC is detected in the sensor SEN using a capacitor shunt 250 allowing good sensitivity and accuracy of detection by conventional measuring devices and also providing a good suppression of overvoltages. A surge arrester 240 connected in parallel to the capacitor shunt 250 serves as a second line of defense. The radio frequency signal RFI is detected using a radio frequency current transformer 91, the primary winding 90 of which is in the circuit of the capacitor shunt 250. The polarity terminal (*) for the winding 91 is connected to the tap 234 output. The superposition of both signals in one circuit is accomplished by the connection of the non-polarity terminals of the secondary 92 and the primary winding 90. The polarity terminal (*) of the secondary winding 92 of the radio frequency current transformer 91 is connected to the signal conductor 246 of the connecting circuit 244. High sensitivity of the sensor SEN to the radio frequency signals RFI is accomplished by placing the surge arrester 240 in parallel with the capacitor shunt 250, instead of its usual connection directly to the capacitor tap output 234.

The input circuit for the remote measuring devices REM of FIG. 26 is to separate the power signal related to signal IC and the radio frequency signals related to signal RFI, to reduce interference and the susceptibility of the system to the hazardous differences in transient ground potentials at the opposite ends of the connecting circuit, and-to eliminate the formation of power frequency current loops through the connecting circuit 244. This is accomplished by the combination of several things: the grounding of the second conductor (shield) 248 in the connecting circuit 244 is made at the sending end SEN only; an additional surge arrester 254 is installed between the signal conductor 246 of the connecting circuit 244 and the remote Ground GM at the remote end REM; and the impedance of the capacitor shunt 258 at the power frequency is chosen much higher than that of the measuring equipment. The power frequency signal is detected across the additional surge arrester 254 through a small inductance (choke) coil 260, thus preventing the radio frequency signal from penetration into the power frequency measuring equipment PMD. The radio frequency signals are detected between the signal conductor 246 of the connection circuit 244 and its second conductor 248, and the galvanic isolation of the radio frequency measuring circuit RFMD is provided with a radio frequency isolating transformer 265 of which primary winding 256 is combined in series with a small capacitor 258 to block the penetration of power frequency current into this circuit.

It is understood that the transformer 91, primary current transformer winding 90, the secondary winding 92, the conductor 230 and the capacitance C1 depicted in FIG. 26 are depicted elsewhere in this Specification. For instance, elements 90,91 and 92 may be found in FIGS. 1, 4, 7, 10, 13, 17, 18, 19 and 27. Capacitance C1 of FIG. 26 is also depicted in FIG. 2, 5, 8, 9, 14, 18 (including C1A and C1B), 19 and 20 Conductor 230 of FIG. 26 may also be 60 in FIG. 2 and FIG. 3, 86 and 88 in FIG. 8 and FIG. 10, 120 in FIG. 14, 38 and 168 in FIG. 18, 193 in FIG. 19, 200 in FIG. 20, and 269 in FIG. 27. Points 92A and 92B of FIG. 26 are also depicted in FIG. 1 and FIG. 18. It is also to be understood that the embodiment of FIGS. 1, 13, 18, 19 and 20 may sense and monitor only partial discharge impulses to be fed to prior art monitors such as shown in FIGS. 21–25 or may sense both power frequency current and/partial discharge impulses to be treated in the manner set forth in and described with respect to FIG. 26. Of course, none of these arrangements are limited t the illustrative embodiment shown herein.

What is claimed is:

1. A partial discharge determination system for an electrical system which includes a conductor at a given voltage potential, electrical insulation disposed proximate said conductor, insulator capacitance in said insulation which conducts a partial discharge radio frequency electrical current and a power frequency current component:

a sensor current transformer, said sensor current transformer having a sensor current transformer primary winding and a sensor current transformer secondary winding, said sensor current transformer primary winding having a sensor current transformer primary winding first end and a spaced sensor current transformer primary winding second end, said sensor current transformer secondary winding having a sensor current transformer secondary winding first end and spaced current transformer sensor secondary winding second end;

a sensor capacitor shunt, said sensor capacitor shunt having a sensor capacitor shunt first end and a spaced sensor capacitor shunt second end;

said sensor current transformer primary winding first end being connected electrically to said insulator capacitance in said insulator to conduct said partial discharge electrical current through said sensor current transformer primary winding;

said sensor current transformer primary winding second end, said sensor current transformer secondary winding second end, and said sensor capacitor shunt first end being connected together electrically;

a coaxial cable, said coaxial cable having an inner conductor, said inner conductor having an inner conductor first end and a spaced inner conductor second ends, said coaxial cable having an outer conductor, said outer conductor having an outer conductor first end and a spaced an outer conductor second end;

said coaxial cable inner conductor first end being connected electrically to said sensor current transformer primary winding first end;

a monitoring power frequency capacitor having a monitoring power frequency capacitor first end and a spaced monitoring power frequency capacitor second end;

a monitoring radio frequency isolation transformer having a monitoring radio frequency isolation transformer primary winding and a monitoring radio frequency isolation transformer secondary winding, said monitoring radio frequency isolation transformer primary winding having a monitoring radio frequency isolation transformer primary winding first end and a spaced monitoring radio frequency isolation transformer-primary winding second end, said monitoring radio frequency isolation transformer secondary winding having a monitoring radio frequency isolation transformer secondary winding first end and a spaced monitoring radio frequency isolation transformer secondary winding second end;

a monitoring choke coil, said monitoring coil having a monitoring coil first end and a spaced monitoring choke coil second end;

said monitoring choke coil first end, and said monitoring power frequency capacitor first end being interconnected electrically with said coaxial conductor inner conductor second end;

said monitoring radio frequency isolation transformer primary winding first end being interconnected electrically with said monitoring power frequency capacitor second end;

a monitoring surge arrester, said monitoring surge arrester having a monitoring surge arrester first end and a spaced monitoring surge arrester second end;

said monitoring choke coil first end, said monitoring surge arrester first end, and said monitoring power frequency capacitor first end being interconnected electrically with said coaxial conductor inner conductor second end;

said monitoring radio frequency isolation transformer primary winding second end being interconnected electrically with said coaxial conductor outer conductor second end;

a first signal representative of said partial discharge electrical current power frequency current component existing between said monitoring choke coil second end and said monitoring surge arrester second end; and a second signal representative of said radio frequency current component existing between said monitoring radio frequency isolation transformer secondary winding first end and said monitoring radio frequency isolation transformer secondary winding second end.

2. The partial discharge determination system of claim 1, wherein said sensor current primary winding first end comprises a polarity terminal of said sensor current primary winding, and said sensor current secondary winding first end comprises a polarity terminal of said sensor current secondary winding.

3. The partial discharge determination system of claim 1, comprising a sensing surge arrester, said sensing surge arrester having a sensing surge arrester first end and a spaced sensing surge arrester second end; and said sensor current transformer primary winding second end, said sensor current transformer secondary winding second end, said sensing surge arrester first end and said sensor capacitor first end being connected together electrically.

4. The partial discharge determination system of claim 3, said sensing surge arrester second end being connected to ground.

5. The partial discharge determination system of claim 1, said sensor capacitor shunt second end being connected to ground.

6. The partial discharge determination system of claim 1, said coaxial cable outer cable first end being connected to ground.

7. The partial discharge determination system of claim 1, said monitoring surge arrester second end being interconnected electrically with ground.

8. An electrical system, comprising:

a conductor at a given voltage potential;

electrical insulation disposed proximate said conductor;

insulator capacitance in said insulation which conducts electrical said current having a power frequency current component and a partial discharge radio frequency current component;

a partial discharge determination system comprising:

a sensor current transformer, said sensor current transformer having a sensor current transformer primary winding and a sensor current transformer secondary winding, said sensor current transformer primary winding having a sensor current transformer primary winding first end and a spaced sensor current transformer primary winding second end, said sensor current transformer secondary winding having a sensor current transformer secondary winding first end and spaced current transformer sensor secondary winding second end;

a sensor capacitor shunt, said sensor capacitor shunt having a sensor capacitor shunt first end and a spaced sensor capacitor shunt second end;

said sensor current transformer primary winding first end being connected electrically to said insulator capacitance in said insulator to conduct said partial discharge electrical current through said sensor current transformer primary winding;

said sensor current transformer primary winding second end, said sensor current transformer secondary winding second end, and said sensor capacitor shunt first end being connected together electrically;

a coaxial cable, said coaxial cable having an inner conductor, said inner conductor having an inner conductor first end and a spaced inner conductor second ends, said coaxial cable having an outer conductor, said outer conductor having an outer conductor first end and a spaced outer conductor second end;

said coaxial cable inner conductor first end being connected electrically to said sensor current transformer primary winding first end;

a monitoring power frequency capacitor having a monitoring power frequency capacitor first end and a spaced monitoring power frequency capacitor second end;

a monitoring radio frequency isolation transformer having a monitoring radio frequency isolation transformer primary winding and a monitoring radio frequency isolation transformer secondary winding, said monitoring radio frequency isolation transformer primary winding having a monitoring radio frequency isolation transformer primary winding first end and a spaced monitoring radio frequency isolation transformer primary winding second end, said monitoring radio frequency isolation transformer secondary winding having a monitoring radio frequency isolation transformer secondary winding first end and a spaced monitoring radio frequency isolation transformer secondary winding second end;

a monitoring choke coil, said monitoring choke coil having a monitoring choke coil first end and a spaced monitoring choke coil second end;

said monitoring choke coil first end, and said monitoring power frequency capacitor first end being interconnected electrically with said coaxial conductor inner conductor second end;

said monitoring radio frequency isolation transformer primary winding first end being interconnected electrically with said monitoring power frequency capacitor second end;

a monitoring surge arrester, said monitoring surge arrester having a monitoring surge arrester first end and a spaced monitoring surge arrester second end;

said monitoring choke coil first end, said monitoring surge arrester first end, and said monitoring power frequency capacitor first end being interconnected electrically with said coaxial conductor inner conductor second end;

said monitoring radio frequency isolation transformer primary winding second end being interconnected electrically with said coaxial conductor outer conductor second end;

a first signal representative of said partial discharge electrical current power frequency current component existing between said monitoring choke coil second end and said monitoring surge arrester second end; and a second signal representative of said radio frequency current component existing between said monitoring radio frequency isolation transformer secondary winding first end and said monitoring radio frequency isolation transformer secondary Winding second end.

9. The electrical system of claim 8, wherein said sensor current primary winding first end comprises a polarity terminal of said sensor current primary winding, and said sensor current secondary winding first end comprises a polarity terminal of said sensor current secondary winding.

10. The electrical system of claim 8, comprising a sensing surge arrester, said sensing surge arrester having a sensing surge arrester first end and a spaced sensing surge arrester second end; and said sensor current transformer primary winding second end, said sensor current transformer secondary winding second end, said sensing surge arrester first end and said sensor capacitor shunt first end being connected together electrically.

11. The electrical system of claim 10, said sensing surge arrester second end being connected to ground.

12. The electrical system of claim 8, said sensor capacitor shunt second end being connected to ground.

13. The electrical system of claim 8, said coaxial cable outer cable first end being connected to ground.

14. The electrical system of claim 8, said monitoring surge arrester second end being interconnected electrically with ground.

15. A remote input circuit for a radio frequency measuring device with input terminal and second terminal and a power frequency singal measuring device with input terminal and ground terminal for the on-line monitoring of the state of the high-voltage insulation in electrical apparatus experiencing partial discharge activity, said partial discharge activity causing the existence of a radio frequency signal, there also being a separate power frequency signal, said radio frequency signal and said power frequency signal being concurrently present, comprising:

a conducting cable having a signal conductor and a second conductor, each signal conductor and second conductor having a local end and a remote end, said local end of said second conductor of said conducting cable being connected to said local ground and having a signal representative of said power frequency signal and a signal representative of said radio frequency signal concurrently disposed thereupon;

said remote end of said second conductor being ungrounded;

a remote surge arrester having a firs end and a second end, said first end of said remote surge arrester being connected to said remote end of said signal conductor, said second end of said remote surge arrester being connected to said remote ground;

a remote inductance having a first end and a second end, said first end of said remote inductance being connected to said remote end of said signal conductor, said second end of said remote inductance being connected to said input terminal of said power frequency signal measuring device, said ground terminal of said power frequency signal measuring device being connected to remote ground;

a remote capacitance having a first end and a second end;

a remote radio frequency isolating transformer with a primary winding having a first terminal and a second terminal and a secondary winding having a first terminal and a second terminal;

said second end of said remote capacitance being connected to said first end of said primary winding of said remote radio frequency isolating transformer;

said first end of said remote capacitance being connected to said remote end of said signal conductor of said conducting cable and said second end of said primary winding of said remote radio frequency isolating transformer being connected to said second conductor of said conducting cable;

said first terminal of said secondary winding of said remote radio frequency isolating transformer being connected to said input terminal of said radio frequency signal measuring device, said second terminal of said radio frequency signal measuring device being connected to said second terminal of said secondary winding of said remote radio frequency isolating transformer.

16. Electrical apparatus of the kind which experiences partial discharge in the high-voltage insulation thereof, said partial discharge activity causing the existence of a radio frequency component, there being a separate power frequency component, said radio frequency component and said power frequency component generating a local radio frequency signal and power frequency signal, respectively, in a local sensor for transmittal to a remote input circuit for a radio frequency measuring device with input terminal and second terminal and a power frequency signal measuring device with input terminal and ground terminal for the on-line monitoring of the state of the high-voltage insulation in said electrical apparatus experiencing said partial discharge activity, comprising:

a conducting cable having a signal conductor and a second conductor, each said signal conductor and second conductor having a local end and a remote end, said local end of said second conductor of said conducting cable being connected to said local ground and having a signal representative of said power frequency component and a signal representative of said radio frequency component concurrently disposed thereupon;

said remote end of said second conductor being ungrounded;

a remote surge arrester having a first end and a second end, said first en of said remote surge arrester being connected to said remote end of said signal conductor, said second end of said remote surge arrester being connected to said remote ground;

a remote inductance having a first end and a second end, said first end of said remote inductance being connected to said remote end of said signal conductor, said second end of said remote inductance being connected to said input terminal of said power frequency signal measuring device, said ground terminal of said power frequency signal measuring device being connected to remote ground;

a remote capacitance having a first end and a second end;

a remote radio frequency isolating transformer with a primary winding having a first terminal and a second terminal and a secondary winding having a first terminal and a second terminal;

said second end of said remote capacitance being connected to said first end of said primary winding of said remote radio frequency isolating transformer;

said first end of said remote capacitance being connected to said remote end of said signal conductor of said conducting cable and said second end of said primary winding of said remote radio frequency isolating transformer being connected to said second conductor of said conducting cable; and said first terminal of said secondary winding of said remote radio frequency isolating transformer being connected to said input terminal of said radio frequency signal measuring device, said second terminal of said radio frequency signal measuring device being connected to said second terminal of said secondary winding of said remote radio frequency isolating transformer.

\* \* \* \* \*